(12) United States Patent
Uchiyama

(10) Patent No.: US 8,004,090 B2
(45) Date of Patent: Aug. 23, 2011

(54) SEMICONDUCTOR DEVICE AND METHOD FOR MANUFACTURING THE SAME

(75) Inventor: Shiro Uchiyama, Tokyo (JP)

(73) Assignee: Elpida Memory, Inc, Tokyo (JP)

( * ) Notice: Subject to any disclaimer, the term of this patent is extended or adjusted under 35 U.S.C. 154(b) by 132 days.

(21) Appl. No.: 12/258,547

(22) Filed: Oct. 27, 2008

(65) Prior Publication Data

US 2009/0108464 A1 Apr. 30, 2009

(30) Foreign Application Priority Data

Oct. 29, 2007 (JP) ................. 2007-280338

(51) Int. Cl.
*H01L 23/48* (2006.01)
*H01L 23/52* (2006.01)
*H01L 29/40* (2006.01)

(52) U.S. Cl. ........ 257/774; 257/698; 257/773; 257/775; 257/E21.577; 257/E21.578

(58) Field of Classification Search .............. 257/698, 257/773–775, E21.577, E21.578
See application file for complete search history.

(56) References Cited

U.S. PATENT DOCUMENTS

| 2002/0180015 A1* | 12/2002 | Yamaguchi et al. ......... 257/678 |
| 2007/0262424 A1* | 11/2007 | Hiatt ........................ 257/667 |
| 2007/0262464 A1* | 11/2007 | Watkins et al. ............. 257/774 |
| 2007/0284729 A1* | 12/2007 | Kwon et al. ................ 257/700 |
| 2007/0287265 A1* | 12/2007 | Hatano et al. .............. 438/458 |
| 2008/0136038 A1* | 6/2008 | Savastiouk et al. ......... 257/774 |
| 2008/0237849 A1* | 10/2008 | Pratt ........................ 257/737 |
| 2009/0045502 A1* | 2/2009 | Adkisson et al. ........... 257/693 |

FOREIGN PATENT DOCUMENTS

| JP | 04-311069 | 11/1992 |
| JP | 11-163135 | 6/1999 |
| JP | 2005-093486 | 4/2005 |
| JP | 2006-032695 | 2/2006 |
| JP | 2006-108520 | 4/2006 |
| JP | 2006-261403 | 9/2006 |

OTHER PUBLICATIONS

P.S. Andry et al., A CMOS-compatible Process for Fabricating Electrical Through-vias in Silicon, 2006 Electronic Components and Technology Conference, pp. 1-7.

* cited by examiner

*Primary Examiner* — Kevin M Picardat
*Assistant Examiner* — Bac H Au
(74) *Attorney, Agent, or Firm* — Young & Thompson

(57) ABSTRACT

A first insulating layer including a first contact pad made of conductive polysilicon and a second insulating layer including a second contact pad are formed over a semiconductor silicon layer. After this, a via hole for a through-hole electrode is formed until the via hole penetrates through at least the semiconductor silicon layer and the first contact pad and reaches to the second contact pad.

10 Claims, 19 Drawing Sheets

SEMICONDUCTOR DEVICE AND METHOD FOR MANUFACTURING THE SAME

This application is based upon and claims the benefit of priority from Japanese Patent Application No 2007-280338, filed on Oct. 29, 2007, the disclosure of which is incorporated herein in its entirety by reference.

BACKGROUND OF THE INVENTION

1. Field of the Invention

The present invention relates to a semiconductor device comprising a through-hole electrode and a method for manufacturing the semiconductor device.

2. Description of the Related Art

Conventionally, the mainstream of semiconductor device configuration has been that a single semiconductor device is equipped with a single semiconductor silicon layer. In recent years, however, there have been proposed such semiconductor device configuration in which a single semiconductor device is equipped with a plurality of semiconductor silicon layers. More specifically, it is possible to enhance the capabilities of a semiconductor device, including the processing speed, while reducing the size and weight of the semiconductor device as a whole by mounting a plurality of semiconductor silicon layers in a multilayered manner within a single semiconductor device.

When manufacturing this semiconductor device equipped with a plurality of semiconductor silicon layers, it is necessary to laminate and electrically connect the semiconductor silicon layers to one another within the semiconductor device. Hence, as a semiconductor device in which a plurality of semiconductor silicon layers are electrically connected to one another, Japanese Patent Laid-Open No. 2005-93486 proposes a semiconductor device, in which through-hole electrodes are formed inside via holes penetrating through the semiconductor silicon layers within the semiconductor device and these through-hole electrodes are coupled with one another, and a method for manufacturing the semiconductor device.

Japanese Patent Laid-Open No. 2005-93486 (FIGS. 33 to 38) shows a method for manufacturing through-hole electrodes according to this related art. First, as shown in FIG. 33A, interlayer insulating film 153 (made of, for example, a silicon dioxide film or a silicon nitride film), pad electrode 155 (made of, for example, aluminum), passivation film 157 (made of, for example, a silicon dioxide film, a silicon nitride film, or a silicon oxynitride film) are successively formed on a surface of silicon substrate 151. Next, an opening is formed on passivation film 157 to have a surface of pad electrode 155 exposed from this opening.

Next, after conducting a probe test, the rear surface of silicon substrate 151 is polished so that the silicon substrate is thinned down to a thickness of at least 300 µm and so on. Next, surface protection film 161 (for example, a silicon dioxide film) is formed on silicon substrate 151, so as to cover pad electrode 155 and passivation film 157.

Next, as shown in FIG. 33B, silicon dioxide film 163 is formed on the entire rear surface of polished silicon substrate 151. Next, there is formed first resist mask 165 including opening 167 at a position corresponding to pad electrode 155 on the rear surface of silicon substrate 151 (FIG. 33C). Using this resist mask 165 as a mask, silicon dioxide film 163 is etched to form hard mask 163' including opening 167 at a position corresponding to pad electrode 155, as shown in FIG. 34A.

Next, as shown in FIG. 34B, resist mask 165 is removed. After this, silicon substrate 151 is etched using this hard mask 163' as a mask to form opening 169 including interlayer insulating film 153 shown in FIG. 34C as the bottom face thereof. The etching of this silicon substrate 151 is carried out by dry etching using an etching gas such as an $SF_6$ or $SF_6/O_2$-based etching gas.

Subsequently, after removing hard mask 163' as shown in FIG. 35A, insulating film 171 (for example, a silicon dioxide film) is formed to a thickness of approximately 1 µm on the entire rear surface of silicon substrate 151 in which this opening 169 has been formed, as shown in FIG. 35B. After this, the bottom face of opening 169 is exposed as shown in FIG. 35C, and there is formed second resist mask 175 for covering the sidewalls of opening 169 and portions other than opening 169.

Next, as shown in FIG. 36A, interlayer insulating film 153 is etched using second resist mask 175 as a mask to form opening 177 including pad electrode 155 as the bottom face thereof. This opening 177, along with opening 169, composes through-hole H. The etching of this interlayer insulating film 153 is carried out by dry etching using a mixed gas composed of, for example, $CF_4$, $CHF_3$, $C_2F_6$, $O_2$, He and the like. After this, second resist mask 175 is removed (FIG. 36B).

Next, as shown in FIG. 36C, underlying metal film 173 (for example, Au, Ti, or Ni) is formed using a sputtering method on the entire rear surface of silicon substrate 1 in which through-hole H has been formed.

Next, as shown in FIG. 37A, a region in which a plug electrode including through-hole H is to be formed is exposed and third resist mask 179 covering portions other than the region is formed on underlying metal film 173. After this, as shown in FIG. 37B, a metal material, such as copper, is deposited on underlying metal film 173 by electrolytic plating and nonelectrolytic plating, so as to fill through-hole H exposed from below this resist mask 179, thereby forming electrode 181. After forming this electrode 181, third resist mask 179 is removed as shown in FIG. 37C.

After this, as shown in FIG. 38, underlying metal film 173 exposed from below electrode 181 is etched and removed. Then, surface protection film 161 present on the front surface side of silicon substrate 151 is etched and removed to complete IC chip 150.

In the method for manufacturing a semiconductor device including a through-hole disclosed in Japanese Patent Laid-Open No. 2005-93486, however, a photolithographic technique is used twice when processing the opening from the rear surface. In addition, the type of etching gas is changed after etching silicon substrate 151, and then interlayer insulating film 153 is etched. This Japanese Patent Laid-Open No. 2005-93486 discloses that an etching gas, such as an $SF_6$ or $SF_6/O_2$-based etching gas, is used for the etching of silicon substrate 151 and a mixed gas composed of $CF_4$, $CHF_3$, $C_2F_6$, $O_2$, He and the like is used for the subsequent etching of interlayer insulating film 153. This means that these two types of etching need to be carried out using separate apparatus (separate chambers), thus involving transferring a semiconductor wafer at each time of etching. Consequently, the above-described method causes not only the prolongation of the manufacturing period of the semiconductor device but also an increase in the cost of manufacture.

In addition, as described above, separate photolithographic techniques are required for the etching of silicon substrate 151 and interlayer insulating film 153. This results in the problem of variation caused when creating openings by etching silicon substrate 151 and interlayer insulating film 153. In particular, the thickness of interlayer insulating film 153 itself varies due to an in-plane variation, a plane-to-plane variation, or a lot-to-lot variation in a semiconductor wafer caused by a film-forming apparatus at the time of film-forming and due to a variation in the semiconductor wafer caused by a CMP apparatus used to planarize the wafer. Consequently, a failure of creating a contact hole for contact with a metal layer (pad electrode) due to under-etching or damage to the metal layer (pad electrode) due to over-etching is caused by a variation in the thickness of interlayer insulating film 153 in a through-hole electrode where an opening is to be created by etching.

Furthermore, there arises the need to add a step of measuring this film thickness, as well as a step of additional growth if the film thickness is thin or a step of etching or the like if the film thickness is too thick, in order to suppress this variation in the thickness of interlayer insulating film 153. Also in this regard, the above-described method causes the prolongation of the manufacturing period of the semiconductor device and an increase in the cost of manufacture.

The present inventors have recognized that if a polysilicon contact pad made of polysilicon is provided as a conductive pad in at least an insulating layer in contact with a semiconductor silicon layer, it is possible to form a via hole both in the semiconductor silicon layer and in the conductive polysilicon within the insulating layer in a single step, since both this polysilicon contact pad and the semiconductor silicon layer are made of silicon. The inventor has thus achieved the present invention.

SUMMARY OF THE INVENTION

The present invention seeks to solve one or more of the above problems, or to improve upon those problems at least in part.

In one embodiment, there is provided a method for manufacturing a semiconductor device, comprising:

forming an insulating layer over a first principal surface of a semiconductor silicon layer;

forming a conductive layer comprising a first conductive layer over the first principal surface and a second conductive layer made of different material from the first conductive layer over the first conductive layer such that the conductive layer penetrates through a predetermined portion of the insulating layer, forming a via hole penetrating through the semiconductor silicon layer and the first conductive layer to reach to the second conductive layer, from a second principal surface side of the semiconductor silicon layer; and forming a through-hole electrode inside the via hole, In another embodiment, there is provided a method for manufacturing a semiconductor device, comprising.

(1) preparing a semiconductor silicon layer including a conduction-preventing impurity region on a first principal surface side of the semiconductor silicon layer;

(2) forming a structure including a first insulating layer with a first contact pad and a second insulating layer with a second contact pad in order over the first principal surface of the semiconductor silicon layer, wherein the first contact pad is made of conductive polysilicon and penetrates through the first insulating layer in the thickness direction of the first insulating layer to have contact with the conduction-preventing impurity region, and the second contact pad penetrates through the second insulating layer in the thickness direction of the second insulating layer at a position corresponding to the first contact pad;

(3) forming a third insulating layer including an interconnect layer over the second insulating layer at a position corresponding to the second contact pad;

(4) decreasing the film thickness of the semiconductor silicon layer by polishing a surface opposite to the surface of the semiconductor silicon layer over which the first insulating layer is formed;

(5) forming a fourth insulating layer over the entire surface of the semiconductor silicon layer from a side opposite to the side of the semiconductor silicon layer over which the first insulating layer is formed;

(6) forming a via hole so as to penetrate through a position corresponding to the second contact pad within the fourth insulating layer;

(7) extending the via hole within the semiconductor silicon layer and the first contact pad to reach to at least the second contact pad;

(8) providing a fifth insulating layer over the entire surface of the semiconductor silicon layer from a side opposite to the side of the semiconductor silicon layer over which the first insulating layer is formed;

(9) removing the fifth insulating layer over a bottom face of the via hole by performing etching back; and

(10) forming a through-hole electrode so as to fill the via hole,

In another embodiments there is provided a method for manufacturing a semiconductor device, comprising:

(1) preparing a semiconductor silicon layer including a cylindrical insulator formed so as to extend from the first principal surface side of the semiconductor silicon layer to a predetermined depth and surround a through-hole electrode forming region;

(2) forming a structure including a first insulating layer with a first contact pad and a second insulating layer with a second contact pad in order over the first principal surface of the semiconductor silicon layer, wherein the first contact pad is made of conductive polysilicon and penetrates through the first insulating layer in the thickness direction of the first insulating layer to reach to the first principal surface of a region of the semiconductor silicon layer surrounded by the cylindrical insulator, and the second contact pad penetrates through the second insulating layer in the thickness direction of the second insulating layer at a position corresponding to the first contact pad;

(3) forming a third insulating layer including an interconnect layer over the second insulating layer at a position corresponding to the second contact pad;

(4) exposing the cylindrical insulator by polishing a surface of the semiconductor silicon layer opposite to the first principal surface to decrease the film thickness of the semiconductor silicon layer;

(5) forming a fourth insulating layer over the entire surface of the semiconductor silicon layer from a side opposite to the side of the semiconductor silicon layer over which the first insulating layer is formed;

(6) forming a via hole so as to penetrate through a position corresponding to the second contact pad within the fourth insulating layer;

(7) extending the via hole within the semiconductor silicon layer and the first contact pad to reach to at least the second contact pad; and (8) forming a through-hole electrode so as to fill the via hole.

In another embodiment, there is provided a semiconductor device, comprising:

an insulating layer formed over a first principal surface of a semiconductor silicon layer;

a conductive layer comprising a first conductive layer and a second conductive layer made of mutually different materials, wherein the first conductive layer is formed over the first principal surface and the second conductive layer is formed over the first conductive layer, so as to penetrate through a predetermined portion of the insulating layer, a via hole formed so as to penetrate through the semiconductor silicon layer and the first conductive layer to reach to the second conductive layer, from a second principal surface side of the semiconductor silicon layer; and a through-hole electrode formed inside the via hole.

In another embodiment, there is provided a semiconductor device, comprising:

a fourth insulating layer, a semiconductor silicon layer, a first insulating layer a second insulating layer and a third insulating layer formed in order;

a first contact pad penetrating through the first insulating layer in the thickness direction of the first insulating layer and made of conductive polysilicon;

a second contact pad and an interconnect layer formed so as to respectively penetrate through positions corresponding to the first contact pad within the second and the third insulating layers in the thickness directions of the second and the third insulating layers;

a through-hole electrode formed so as to penetrate through at least the fourth insulating layer, the semiconductor silicon layer and the first contact pad to reach to the second contact pad;

a fifth insulating layer formed at least between the through-hole electrode and the semiconductor silicon layer; and a conduction-preventing impurity region formed in the semiconductor silicon layer so as to include a portion in contact with the first contact pad.

In another embodiment, there is provided a semiconductor device, comprising:

a fourth insulating layer, a semiconductor silicon layer, a first insulating layer, a second insulating layer and a third insulating layer formed in order;

a first contact pad penetrating through the first insulating layer in the thickness direction of the first insulating layer and made of conductive polysilicon;

a second contact pad and an interconnect layer formed so as to respectively penetrate through positions corresponding to the first contact pad within the second and the third insulating layers in the thickness directions of the second and the third insulating layers;

a through-hole electrode formed so as to penetrate through at least the fourth insulating layer, the semiconductor silicon layer and the first contact pad to reach to the second contact pad; and a cylindrical insulator surrounding the through-hole electrode and penetrating through the semiconductor silicon layer in the thickness direction of the semiconductor silicon layer.

In another embodiment, there is provided a method for manufacturing a semiconductor device, comprising:

forming an insulating layer over a first principal surface of a semiconductor silicon layer;

forming a first conductive layer made of metal material over the first principal surface and a second conductive layer made of metal material over the first conductive layer such that the first and the second conductive layers penetrate through a predetermined portion of the insulating layer, forming a via hole penetrating through the semiconductor silicon layer to reach to at least the first conductive layer, from a second principal surface side of the semiconductor silicon layer; and forming a through-hole electrode inside the via hole.

In another embodiment, there is provided a semiconductor device, comprising:

an insulating layer formed over a first principal surface of a semiconductor silicon layer, a conductive layer comprising a first conductive layer and a second conductive layer made of mutually different materials, wherein the first conductive layer is formed over the first principal surface and the second conductive layer is formed over the first conductive layer, so as to penetrate through a predetermined portion of the insulating layer;

a via hole formed so as to penetrate through the semiconductor silicon layer to reach to at least the first conductive layer, from a second principal surface side of the semiconductor silicon layer; and a through-hole electrode formed inside the via hole.

Accordingly, it is possible to provide a semiconductor device which makes it possible to easily form a through-hole electrode therein and improve the manufacturing yield of the semiconductor device.

BRIEF DESCRIPTION OF THE DRAWINGS

The above features and advantages of the present invention will be more apparent from the following description of certain preferred embodiments taken in conjunction with the accompanying drawings, in which.

Figure 1:
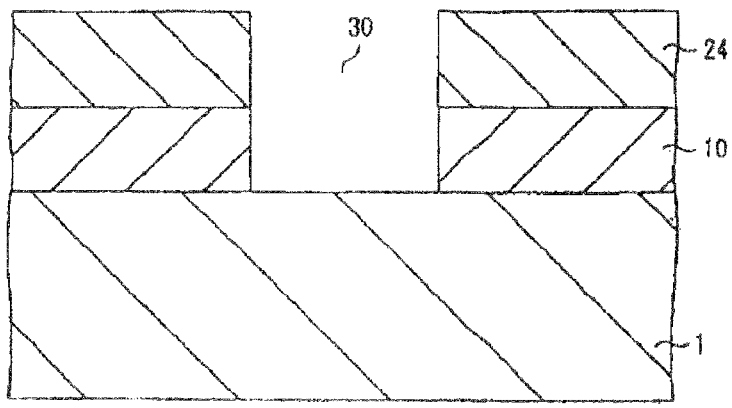
FIG. 1 is a schematic cross-sectional view of a substantial part used to explain a step of forming first and second contact pads in contact with a surface of a semiconductor silicon layer, which is one step of a method for manufacturing a semiconductor device of the present invention.

In the drawings, numerals have the following meanings. 1: semiconductor silicon layer, 2 polysilicon contact pad, 3 metal contact pad, 4: metal interconnect layer, 5: conduction-preventing impurity region, 10, 12, 14: 16, 18, 20, 22: interlayer insulating film, 24: photoresist layer, 30: opening, 40: conductive pad, 50: first external connection contact, 52: first aluminum interconnect, 54: second external connection contact, 56: second aluminum interconnect, 58: support medium made of quartz, 59: adhesive agent, 60, 62, 64: insulating layer, 70: via hole, 72, 74, 76: interlayer insulating film, 80: isolation film, 90: first contact, 100: second contact, 110: metal pad, 150: IC chip, 151: silicon substrate, 153: interlayer insulating film, 155: pad electrode, 157: passivation film, 161: surface protection film, 163: silicon dioxide film, 163': hard mask, 165: first resist mask, 167, 169, 177: opening, 171: insulating film, 173: underlying metal film, 175: second resist mask, 179: third resist mask, 181: electrode, 200, 202: through-hole electrode, 210, 212: electrode pad, 220: seed film, 222, 224: internal through-hole electrode 226: cylindrical semiconductor silicon, 230: bump, 240: cylindrical electrode/substrate-separating hole 250 outer-circumferentially cylindrical insulator, 300, 301, 302, 303: field-effect transistor, 400, 401, 402, 403: semiconductor device

DETAILED DESCRIPTION OF THE PREFERRED EMBODIMENTS

1. Method for Manufacturing Semiconductor Device

The invention will be now described herein with reference to illustrative embodiments. Those skilled in the art will recognize that many alternative embodiments can be accomplished using the teachings of the present invention and that the invention is not limited to the embodiments illustrated for explanatory purposes.

1-1 First Embodiment

A manufacturing method of the first embodiment comprises (1) preparing a semiconductor silicon layer including a conduction-preventing impurity region on a first principal surface side of the semiconductor silicon layer;

(2) forming a structure including a first insulating layer with a first contact pad and a second insulating layer with a second contact pad in order over the first principal surface of the semiconductor silicon layer, wherein the first contact pad is made of conductive polysilicon and penetrates through the first insulating layer in the thickness direction of the first insulating layer to have contact with the conduction-preventing impurity region, and the second contact pad penetrates through the second insulating layer in the thickness direction of the second insulating layer at a position corresponding to the first contact pad;

(3) forming a third insulating layer including an interconnect layer over the second insulating layer at a position corresponding to the second contact pad;

(4) decreasing the film thickness of the semiconductor silicon layer by polishing a surface opposite to the surface of the semiconductor silicon layer over which the first insulating layer is formed;

(5) forming a fourth insulating layer over the entire surface of the semiconductor silicon layer from a side opposite to the side of the semiconductor silicon layer over which the first insulating layer is formed;

(6) forming a via hole so as to penetrate through a position corresponding to the second contact pad within the fourth insulating layer;

(7) extending the via hole within the semiconductor silicon layer and the first contact pad to reach to at least the second contact pad;

(8) providing a fifth insulating layer over the entire surface of the semiconductor silicon layer from a side opposite to the side of the semiconductor silicon layer over which the first insulating layer is formed;

(9) removing the fifth insulating layer over a bottom face of the via hole by performing etching back; and

(10) forming a through-hole electrode so as to fill the via hole.

1-2 Second Embodiment

A manufacturing method of the second embodiment comprises:

(1) preparing a semiconductor silicon layer including a cylindrical insulator formed so as to extend from the first principal surface side of the semiconductor silicon layer to a predetermined depth and surround a through-hole electrode forming region;

(2) forming a structure including a first insulating layer with a first contact pad and a second insulating layer with a second contact pad in order over the first principal surface of the semiconductor silicon layer, wherein the first contact pad is made of conductive polysilicon and penetrates through the first insulating layer in the thickness direction of the first insulating layer to reach to the first principal surface of a region of the semiconductor silicon layer surrounded by the cylindrical insulator, and the second contact pad penetrates through the second insulating layer in the thickness direction of the second insulating layer at a position corresponding to the first contact pad;

(3) forming a third insulating layer including an interconnect layer over the second insulating layer at a position corresponding to the second contact pad;

(4) exposing the cylindrical insulator by polishing a surface of the semiconductor silicon layer opposite to the first principal surface to decrease the film thickness of the semiconductor silicon layer;

(5) forming a fourth insulating layer over the entire surface of the semiconductor silicon layer from a side opposite to the side of the semiconductor silicon layer over which the first insulating layer is formed;

(6) forming a via hole so as to penetrate through a position corresponding to the second contact pad within the fourth insulating layer;

(7) extending the via hole within the semiconductor silicon layer and the first contact pad to reach to at least the second contact pad; and (8) forming a through-hole electrode so as to fill the via hole.

In the above-described first embodiment, the through-hole electrode and the semiconductor silicon layer are insulated from each other by forming the fourth and fifth insulating layers therebetween in steps (5) and (8). In contrast, the second embodiment differs from the first embodiment in that the through-hole electrode and the semiconductor silicon layer are insulated from each other by forming the cylindrical insulator and the fourth insulating layer in the semiconductor silicon layer in steps (1) and (5).

1-3 Operation/Working-Effects of First and Second Embodiments

According to the first and second embodiments, the first contact pad made of conductive polysilicon is formed in the first insulating layer formed over the semiconductor silicon layer at least in step (2). Consequently, it is possible to remove the semiconductor silicon layer and the first contact pad in a single step of photoresist exposure when forming the via hole for the through-hole electrode from the rear surface side of the semiconductor silicon layer in step (7). Thus, it is possible to form the via hole for the through-hole electrode with ease and high precision. As described above, the first and second embodiments do not require etching the interlayer insulating film as a separate step, thereby making it possible to solve the problems found in Japanese Patent Laid-Open No. 2005-93486 once for all.

In addition, the first and second contact pads and the interconnect layer have already been formed prior to forming the through-hole electrode. Thus, there is no need to newly form a metal interconnect layer over the front surface side of the semiconductor silicon layer when forming the through-hole electrode from the rear surface side of the semiconductor silicon layer. That is, the present embodiments makes feasible a simplified step of forming the through-hole electrode from the rear surface of the semiconductor silicon layer by devising a manufacturing step over the front surface side of the semiconductor silicon layer. Thus, the first and second embodiments provide specific means for solving the problems found in Japanese Patent Laid-Open No. 2005-93486 and enabling the formation of the through-hole electrode with high reliability and high manufacturing yield.

The manufacturing methods of the present embodiments are widely applicable to a general class of semiconductor devices provided with a through-hole electrode. The semiconductor devices includes a semiconductor device using an interposer, in addition to, for example, a semiconductor device equipped with an LSI provided with a logic circuit, a semiconductor device equipped with an LSI provided with a memory circuit, and a semiconductor device equipped with an LSI stacked with two or more types of these LSIs.

In addition, in the first and second embodiments, the first and second insulating layers may be made of the same material and may be formed simultaneously. Furthermore, the first and second contact pads may be made of the same material and the first and second contact pads may be formed simultaneously. Still further, the third insulating layer may be made of the same material as that of the first and second insulating layers.

In the first embodiment, a p-type semiconductor silicon layer including an n-type conduction-preventing impurity region on the first principal surface side thereof or an n-type semiconductor silicon layer including a p-type conduction-preventing impurity region on the first principal surface side thereof is prepared in step (1). The first embodiment can further include, between steps (1) and (2), a step (11) of forming a field-effect transistor in a predetermined region other than the conduction-preventing impurity region on the first principal surface side of the semiconductor silicon layer. The first embodiment can also include, in step (2), a step of providing a first insulating layer over the first principal surface, providing a first contact pad so as to have contact with the conduction-preventing impurity region, and providing a contact plug electrically connected to the source/drain region of the field-effect transistor within the first insulating layer. In this semiconductor device, a source/drain region, a gate insulating film and a gate electrode can be formed in predetermined regions to configure a field-effect transistor. Then, this field-effect transistor can be electrically connected by wiring to another field-effect transistor, a through-hole electrode or the like. With this configuration, it is possible to enhance the capabilities of the semiconductor device, including the processing speed, while reducing the size and weight of the semiconductor device as a whole provided with the through-hole electrode (for example, DRAM (Dynamic Random Access Memory) device).

This "conduction-preventing impurity region" means a region formed so that the first contact pad entirely covers a portion in contact with the semiconductor silicon layer in a surface (first principal surface) of the semiconductor silicon layer over which the first insulating layer is provided. By, for example, providing an n-type conduction-preventing impurity region in surface of the p-type semiconductor silicon layer and thereby forming a pn junction, it is possible to prevent conduction between a signal (at an amplitude between, for example, ±1.5 V and a ground potential) transferred through the first contact pad and the semiconductor silicon layer (at, for example, the ground potential).

The second embodiment can further include, between steps (1) and (2), a step (9) of forming a field effect transistor in a predetermined region other than the region surrounded by the cylindrical insulator of the semiconductor silicon layer. The second embodiment can also further include, in step (2), a step of providing a contact plug electrically connected to the source/drain region of the field-effect transistor within the first insulating layer. In this semiconductor device, a source/drain region, a gate insulating film and a gate electrode can be formed in a predetermined region to configure a field-effect transistor. Then, this field-effect transistor can be electrically connected by wiring to another field-effect transistor, a through-hole electrode or the like. With this configuration, it is possible to enhance the capabilities of the semiconductor device, including the processing speed, while reducing the size and weight of the semiconductor device as a whole provided with the through-hole electrode (for example, DRAM (Dynamic Random Access Memory) device).

In addition, in the first and second embodiments, it is also possible to extend the via hole, so as to penetrate through the semiconductor silicon layer and the first contact pad, by forming a second contact pad made of metal or alloy in step (2) and performing anisotropic etching using the second contact pad as an etching stopper in step (7).

As described above, as a result of performing anisotropic etching using the second contact pad as an etching stopper in step (7), any failure in via hole creation due to faulty etching or over-etching does not occur even if there is a film-thickness variation or the like in the first contact pad or in the semiconductor silicon layer. Consequently, it is possible to improve a product yield and thereby achieve cost reductions.

In addition, in the first and second embodiments, it is also possible to extend the via hole so as to penetrate through the semiconductor silicon layer, the first contact pad and the second contact pad, by forming a second contact pad made of conductive polysilicon in step (2) and performing anisotropic etching using the interconnect layer as an etching stopper in step (7).

As described above, as a result of performing anisotropic etching using the interconnect layer as an etching stopper in step (7), any failure in via hole creation due to faulty etching or over-etching does not occur even if there is a film-thickness variation or the like in the first and second contact pads or in the semiconductor silicon layer. Consequently, it is possible to improve a product yield and thereby achieve cost reductions.

This anisotropic etching in step (7) is preferably reactive ion etching (RIE). By using reactive ion etching as anisotropic etching in step (7) as described above, it is possible to ensure a high etching selection ratio between silicon and metal or alloy composing the second contact pad or between silicon and a material composing the interconnect layer. Consequently, it is possible to even more effectively prevent a failure of creating an opening at the time of etching.

As a material for composing the second contact pad or the interconnect layer, it is possible to use tungsten, aluminum, titanium or copper, or an alloy made of a plurality of materials selected from among these materials. It is also possible to use a multilayer structure composed of any of these metals and titanium nitride, tungsten nitride or tantalum nitride.

2. Semiconductor Device

The invention will be now described herein with reference to illustrative embodiments. Those skilled in the art will recognize that many alternative embodiments can be accomplished using the teachings of the present invention and that the invention is not limited to the embodiments illustrated for explanatory purposes.

2-1 First Embodiment

A semiconductor device of the first embodiment comprises:

a fourth insulating layer, a semiconductor silicon layer, a first insulating layer, a second insulating layer and a third insulating layer formed in order;

a first contact pad penetrating through the first insulating layer in the thickness direction of the first insulating layer and made of conductive polysilicon;

a second contact pad and an interconnect layer formed so as to respectively penetrate through positions corresponding to the first contact pad within the second and the third insulating layers in the thickness directions of the second and the third insulating layers;

a through-hole electrode formed so as to penetrate through at least the fourth insulating layer, the semiconductor silicon layer and the first contact pad to reach to the second contact pad;

a fifth insulating layer formed at least between the through-hole electrode and the semiconductor silicon layer; and a conduction-preventing impurity region formed in the semiconductor silicon layer so as to include a portion in contact with the first contact pad.

2-2 Second Embodiment

A semiconductor device of the second embodiment comprises:

a fourth insulating layer, a semiconductor silicon layer, a first insulating layer, a second insulating layer and a third insulating layer formed in order;

a first contact pad penetrating through the first insulating layer in the thickness direction of the first insulating layer and made of conductive polysilicon;

a second contact pad and an interconnect layer formed so as to respectively penetrate through positions corresponding to the first contact pad within the second and the third insulating layers in the thickness directions of the second and the third insulating layers;

a through-hole electrode formed so as to penetrate through at least the fourth insulating layer, the semiconductor silicon layer and the first contact pad to reach to the second contact pad; and a cylindrical insulator surrounding the through-hole electrode and penetrating through the semiconductor silicon layer in the thickness direction of the semiconductor silicon layer.

2-3 Operation/Working-Effects of First and Second Embodiments

The first and second embodiments make it possible to easily form a through-hole electrode therein and improve the manufacturing yield thereof. In addition, the first and second embodiments can be suitably used as semiconductor devices in the fields of electronics, electrical engineering, telecommunications, control and the like. It is also possible to widely use the first and second embodiments for various types of industrial and commercial computers, control equipment, communications equipment, household electrical appliances, and the like.

In the first and second embodiments, the first insulating layer, the second insulating layer and the third insulating layer may be made of the same material or of different materials. Likewise, the first and second contact pads may be made of the same material or of different materials.

In addition, in the first embodiment, the semiconductor silicon layer is preferably a p-type semiconductor silicon layer including an n-type conduction-preventing impurity region in contact with the first contact pad, or an n-type semiconductor silicon layer including a p-type conduction-preventing impurity region in contact with the first contact pad. The first embodiment can be configured so as to be further provided with a field-effect transistor and a contact plug electrically connected to a source/drain region of the field-effect transistor in the first insulating layer, in a predetermined region other than the conduction-preventing impurity region on the surface side of the semiconductor silicon layer over which the first insulating layer is provided.

The second embodiment can be configured so as to be further provided with a field-effect transistor a contact plug electrically connected to a source/drain region of the field-effect transistor in the first insulating layer, in a predetermined region other than the region of the semiconductor silicon layer surrounded by the cylindrical insulator.

As described above, the field-effect transistor is provided in the predetermined region and this field-effect transistor is electrically connected by wiring to another field-effect transistor a through-hole electrode, or the like. With this configuration, it is possible to realize a high-performance semiconductor device (for example, DRAM (Dynamic Random Access Memory) device) reduced in size and weight and fast in the processing speed and the like.

The first embodiment is configured in such a manner that the first contact pad is made of conductive polysilicon, the through-hole electrode penetrates through the fourth insulating layer, the semiconductor silicon layer and the first contact pad and reaches to the second contact pad, and the fifth insulating layer is further provided between the through-hole electrode and the semiconductor silicon layer. By allowing the through-hole electrode to reach to the second contact pad in this way, it is possible to prevent the occurrence of any failure in via hole creation even if there is a film-thickness variation or the like in the first contact pad or in the semiconductor silicon layer. Consequently, it is possible to improve a product yield and thereby achieve cost reductions.

The second embodiment includes the cylindrical insulator surrounding the through-hole electrode and penetrating through the semiconductor silicon layer in the thickness direction thereof. Since the cylindrical insulator is formed so as to surround the through-hole electrode as described above, it is possible to completely and electrically insulate the through-hole electrode and the first contact pad by the cylindrical insulator and the first insulating layer from the semiconductor silicon layer external to this cylindrical insulator. In the semiconductor silicon layer external to this cylindrical insulator, there are formed semiconductor elements such as a memory array and a peripheral circuit.

The first and second embodiments are preferably configured in such a manner that the second contact pad is made of metal or alloy and the through-hole electrode penetrates through the fourth insulating layer, the semiconductor silicon layer and the first contact pad and reaches to the second contact pad. By allowing the through-hole electrode to reach to the second contact pad in this way, it is possible to prevent the occurrence of any failure in via hole creation even if there is a film-thickness variation or the like in the first contact pad or in the semiconductor silicon layer. Consequently, it is possible to improve a product yield and thereby achieve cost reductions. The first and second embodiments differ from each other in that the fifth insulating layer is further formed between the through-hole electrode and the semiconductor silicon layer in the case of the first embodiment, whereas no such a fifth insulating layer is formed in the case of the second embodiment since the second embodiment includes the cylindrical insulator.

As a material for composing the second contact pad or the interconnect layer in these first and second embodiments it is possible to use tungsten, aluminum, titanium, copper, or an alloy made of a plurality of materials selected from among these materials. It is also possible to use a multilayer structure composed of any of these metals or alloys and titanium nitride, tungsten nitride or tantalum nitride.

Hereinafter, a basic manufacturing method of the present invention will be described by taking exemplary embodiments as examples, while referring to the accompanying drawings.

FIG. 1 is a schematic cross-sectional view of a substantial part used to explain a step of forming a conductive pad (first and second contact pads) in contact with a surface of a semiconductor silicon layer. This exemplary embodiment is intended to explain a basic method for manufacturing a conductive pad and a through-hole electrode of the present invention. Therefore, a conduction-preventing impurity region and a cylindrical insulator for insulating a conductive pad and semiconductor silicon layer 1 from each other are excluded from the drawings and the explanation.

First, semiconductor silicon layer 1 is prepared and interlayer insulating film 10 is formed over this semiconductor silicon layer 1. This interlayer insulating film 10 is made of, for example, oxide silicon. This interlayer insulating film 10 can be formed by, for example, a plasma CVD (Chemical Vapor Deposition) method. Note that semiconductor silicon layer 1 used in the present invention is not limitative in particular. For example, a commercially available product, such as a semiconductor silicon wafer containing a p-type impurity such as boron, can be used as semiconductor silicon layer 1.

Next, after planarizing the upper surface of interlayer insulating film 10 by a CMP (Chemical Mechanical Polishing) method or the like, photoresist layer 24 is formed over the upper surface of the interlayer insulating film 10. An opening pattern is formed in this photoresist layer 24 by a publicly-known lithography method. Using this opening pattern as a mask, opening 30 is formed in interlayer insulating film 10.

Figure 2:
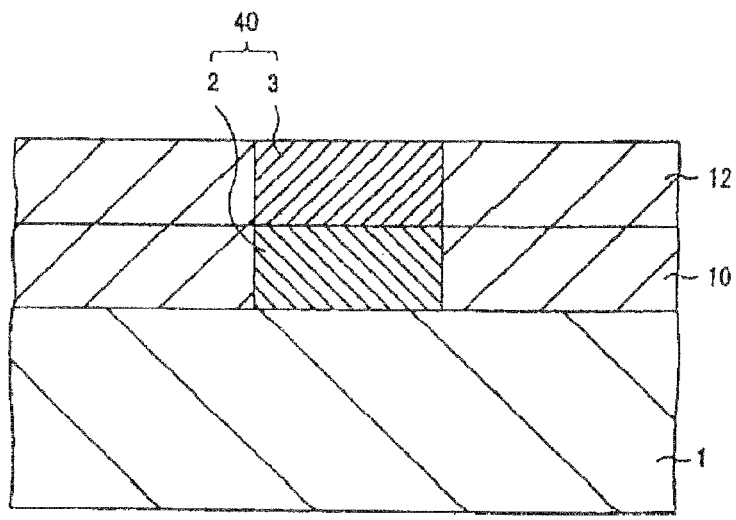
FIG. 2 is a schematic cross-sectional view of a substantial part used to explain a step of forming first and second contact pads in an opening formed in an interlayer insulating film, which is one step of the method for manufacturing the semiconductor device of the present invention.

FIG. 2 is a schematic cross-sectional view of a substantial part used to explain a step of forming interlayer insulating film 12, in addition to interlayer insulating film 10, and then forming conductive pad (first and second contact pads) 40 in opening 30 formed in interlayer insulating films 10 and 12. Examples of this conductive pad 40 include those made of polysilicon doped with such an impurity as phosphorous or arsenic, those made of polysilicon and such metal as tungsten, and those made of a lamination of two or more types of these materials.

Here, an explanation will be made by taking as an example the case in which conductive pad 40 is formed of polysilicon contact pad (first contact pad) 2 and metal contact pad second contact pad) 3.

First, photoresist layer 24 is removed by an ashing step or the like. After this, it is possible to form polysilicon contact pad 2 as part of conductive pad 40 by depositing polysilicon in an opening using a CVD (Chemical Vapor Deposition) method and removing an unnecessary portion by a CMP method. Alternatively, the unnecessary portion may be removed by performing etching back using anisotropic etching instead of the CMP method.

An impurity, such as phosphorous or arsenic, is introduced in addition when carrying out the CVD method, in order to dope the impurity into the polysilicon. Consequently, it is possible to provide conductivity to polysilicon contact pad 2.

After forming polysilicon contact pad 2, unnecessary portions of the upper surfaces of polysilicon contact pad 2 and interlayer insulating film 10 are removed and the upper surfaces are planarized by a CMP method or the like. Then, interlayer insulating film 12 is formed over polysilicon contact pad 2 and interlayer insulating film 10. This removal of unnecessary portions may be carried out by performing etching back using anisotropic etching instead of the CMP method. This interlayer insulating film 12 is made of, for example, oxide silicon. Interlayer insulating film 12 can be formed by, for example, a plasma CVD method.

Subsequently, after planarizing the upper surface of interlayer insulating film 12 by a CMP method or the like, a photoresist layer is formed over the upper surface of the interlayer insulating film 12. After forming an opening pattern in this photoresist layer by a publicly-known lithography method, an opening is formed in interlayer insulating film 12 using this opening pattern as a mask.

Subsequently, after removing the photoresist layer by an ashing step or the like, such metal as tungsten is deposited on the inside of this opening by an MOCVD method. Consequently, it is possible to form metal contact pad 3 shown in FIG. 2.

If metal contact pad 3 made of tungsten or the like is directly formed over polysilicon contact pad 2, a silicide compound may be formed in an interface between polysilicon contact pad 2 and metal contact pad 3 due to heat treatment during a manufacturing step. For this reason, a metal barrier film, such as a titanium nitride film, is preferably formed in the interface between polysilicon contact pad 2 and metal contact pad 3. This titanium nitride film can be formed, for example, by a method for annealing a titanium thin film under a nitrogen atmosphere after forming the titanium thin film by, for example, a sputtering method.

In the present exemplary embodiment, an explanation has been made of a method for forming polysilicon contact pad 2 and metal contact pad 3 in a stepwise manner with regard to the step of forming conductive pad 40. However, the step of forming conductive pad 40 is not limited to this method. For example, the following step can be mentioned as an example of modification of the step of forming conductive pad 40.

For example, after depositing polysilicon by a CVD method over the entire upper surface of semiconductor silicon layer 1, a metal barrier film, such as a titanium nitride film, is formed as necessary. Then, such metal as tungsten is further deposited by an MOCVD method, thereby forming a polysilicon layer and a metal layer over the upper surface of semiconductor silicon layer 1.

Subsequently, the polysilicon layer and the metal layer are subjected to patterning using a publicly-known lithography method, and then an interlayer insulating film made of, for example, oxide silicon is deposited over the entire upper surface of semiconductor silicon layer 1 by a plasma CVD method or the like. Thus, it is possible to obtain the structure including conductive pad 40 shown by way of example in FIG. 2.

In the case of this example of modification, interlayer insulating films 10 and 12 shown by way of example in FIG. 2 are formed of the same material such as oxide silicon. Therefore, no boundary exists in practice between interlayer insulating films 10 and 12.

Figure 3:
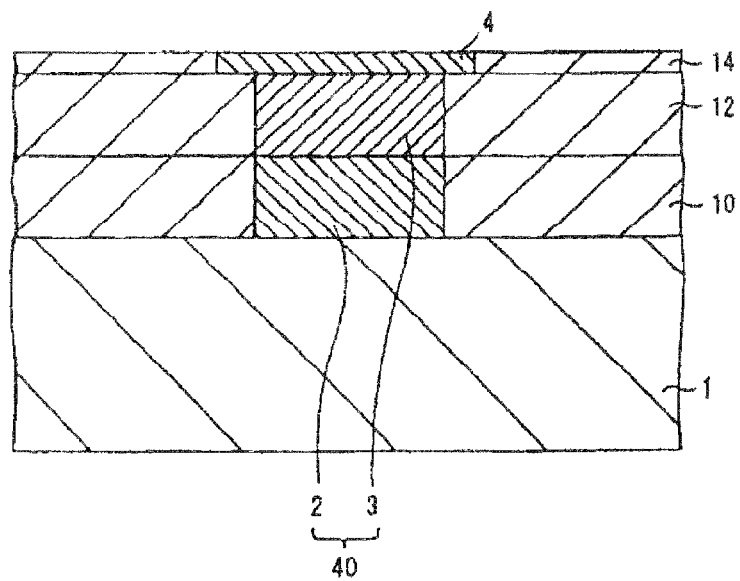
FIG. 3 is a schematic cross-sectional view of a substantial part used to explain a step of forming a metal interconnect layer to be electrically connected to the first and second contact pads over the surface of the semiconductor silicon layer, which is one step of the method for manufacturing the semiconductor device of the present invention.

FIG. 3 is a schematic cross-sectional view of a substantial part used to explain a step of forming a metal interconnect layer 4 to be electrically connected to conductive pad 40 over the surface of the semiconductor silicon layer 1.

First, after planarizing the upper surfaces of conductive pad 40 and interlayer insulating film 12 by a CMP method or the like, interlayer insulating film 14 made of, for example, oxide silicon is formed. The formation of interlayer insulating film 14 can be carried out by means of, for example, a plasma CVD method as in the case of forming interlayer insulating films 10 and 12 described earlier.

After planarizing the upper surface of interlayer insulating film 14 by a CMP method or the like, a photoresist layer (not illustrated) is formed over the upper surface of interlayer insulating film 14. Then, an opening pattern is formed in this photoresist layer by a publicly-known lithography method. Using this opening pattern as a mask, an opening is formed in interlayer insulating film 14. By depositing such metal as tungsten on the inside of this opening by, for example, an MOCVD method, it is possible to form metal interconnect layer 4 to be electrically connected to conductive pad 40.

In addition, as an example of modification of the step of forming metal interconnect layer 4, a metal layer is first formed by depositing such metal as tungsten over the entire upper surfaces of conductive pad 40 and interlayer insulating film 12 by, for example, an MOCVD method. Then, after subjecting the metal layer to patterning by a publicly-known lithography method, an interlayer insulating film made of, for example, oxide silicon is deposited by a plasma CVD method or the like. Thus, it is possible to obtain the structure including metal interconnect layer 4 shown by way of example in FIG. 3.

As described above, it is possible to freely form an upper-layer interconnect structure above semiconductor silicon layer 1 by combining, as appropriate, the step of forming an interlayer insulating film, the step of forming an opening in the interlayer insulating film and the step of depositing metal in the opening.

As a material for composing the second contact pad, metal interconnect layer 4 or the metal interconnect layer of the upper-layer interconnect structure, it is possible to use tungsten, aluminum, titanium, copper, or an alloy made of a plurality of materials selected from among these materials. It is also possible to use a multilayer structure composed of any of these metals or alloys, and titanium nitride, tungsten nitride or tantalum nitride.

Furthermore, it is possible to configure the semiconductor device in such a manner that bump 230 is formed in contact with a surface of metal interconnect layer 4 over conductive pad 40. In this case, bump 230 is formed using solder made of, for example, a tin-silver-copper alloy. A material for forming bump 230 is not limited to solder but may be formed using, for example, conductive paste. The semiconductor device is configured here so that bump 230 is formed over metal interconnect layer 4. Alternatively, an upper interconnect structure may be formed over metal interconnect layer 4, and a bump may be formed over the uppermost metal interconnect layer (for example, aluminum pad).

The upper interconnect structure is not limitative in particular but can be composed as appropriate according to, for example, the purpose of inputting/outputting signals of various circuits, including a logic circuit and a memory circuit. In general, the upper interconnect structure and the bump are formed over metal interconnect layer 4. An explanation will be made of a case here, however, in which bump 230 is formed over metal interconnect layer 4, and then the rear surface of semiconductor silicon layer 1 is processed.

Figure 4:
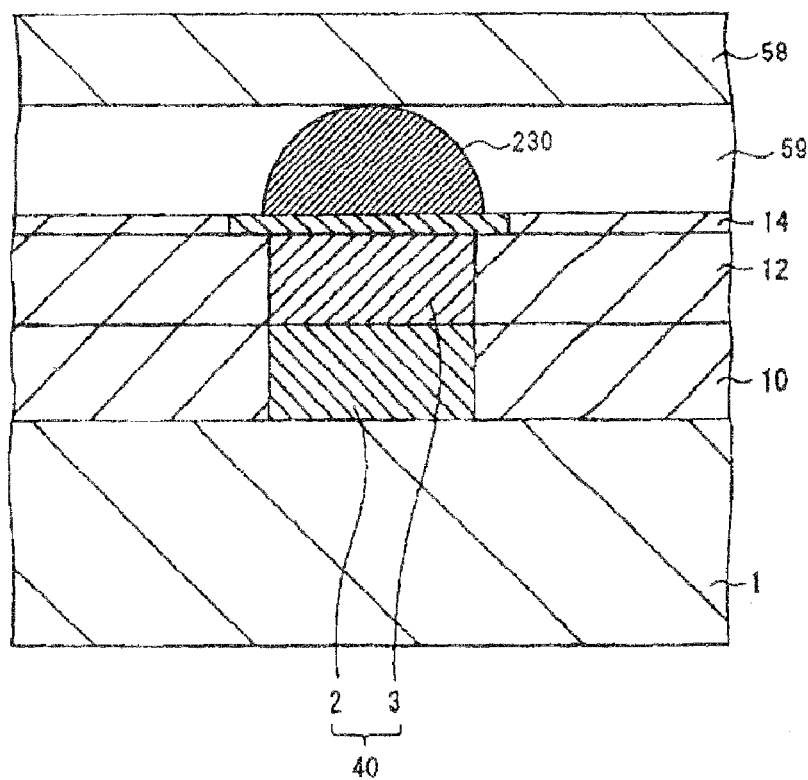
FIG. 4 is a schematic cross-sectional view of a substantial part used to explain a step of forming a bump over the metal interconnect layer, which is one step of the method for manufacturing the semiconductor device of the present invention.

First, as shown by way of example in FIG. 4, support medium 58 made of quartz is bonded onto interlayer insulating film 14 using adhesive agent 59, in order to protect the upper surfaces of bump 230, metal interconnect layer 4 and the like. By bonding this support medium 58, it is possible to prevent any damage or the like from occurring to the upper surfaces of bump 230, metal interconnect layer 4 and the like when carrying out a step of, for example, processing the rear surface of semiconductor silicon layer 1 to be described later. Support medium 58 is taken away, as a rule, when the step of rear surface processing and the like are completed.

Figure 5:
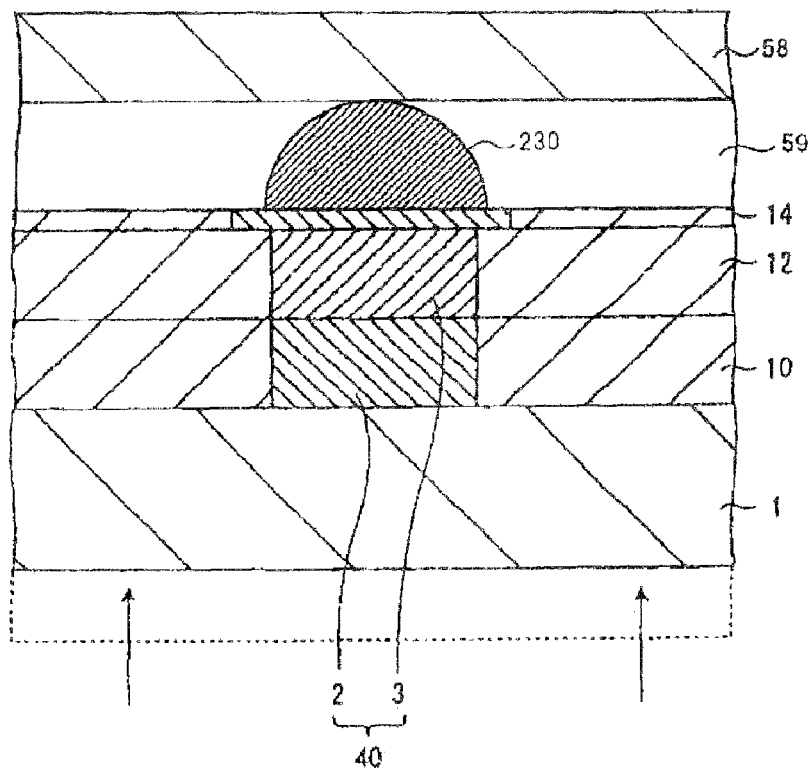
FIG. 5 is a schematic cross-sectional view of a substantial part used to explain a step of polishing the rear surface of the semiconductor silicon layer, which is one step of the method for manufacturing the semiconductor device of the present invention.

Next, the rear surface of semiconductor silicon layer 1 is processed. FIG. 5 is a schematic cross-sectional view of a substantial part used to explain a step of polishing the rear surface of semiconductor silicon layer 1. As shown in FIG. 5, the rear surface of semiconductor silicon layer 1 is polished by a polishing step, so that the thickness of semiconductor silicon layer 1 falls within the range from 10 to 150 μm. A step of polish, such as wet polish or dry polish, may be carried out after polishing the rear surface of semiconductor silicon layer 1.

Figure 6:
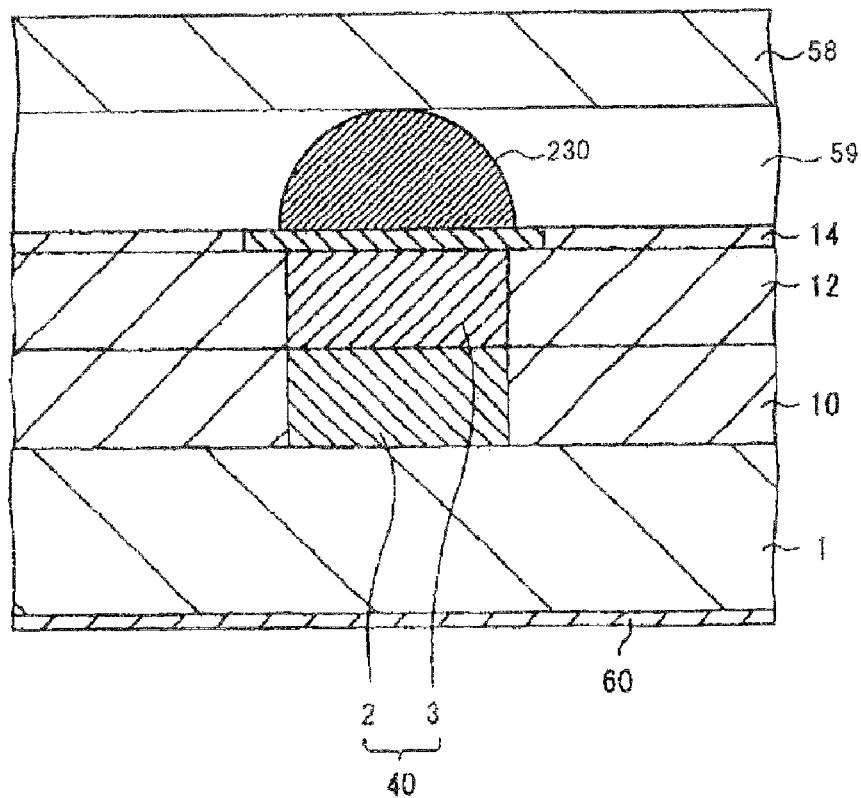
FIG. 6 is a schematic cross-sectional view of a substantial part used to explain a step of forming an insulating layer over the rear surface of the semiconductor silicon layer, which is one step of the method for manufacturing the semiconductor device of the present invention.

FIG. 6 is a schematic cross-sectional view of a substantial part used to explain a step of forming an insulating layer over the rear surface of semiconductor silicon layer 1. As shown in FIG. 6, insulating layer 60 is formed over the rear surface of semiconductor silicon layer 1 by depositing oxide silicon over the rear surface by a plasma CVD method.

Figure 7:
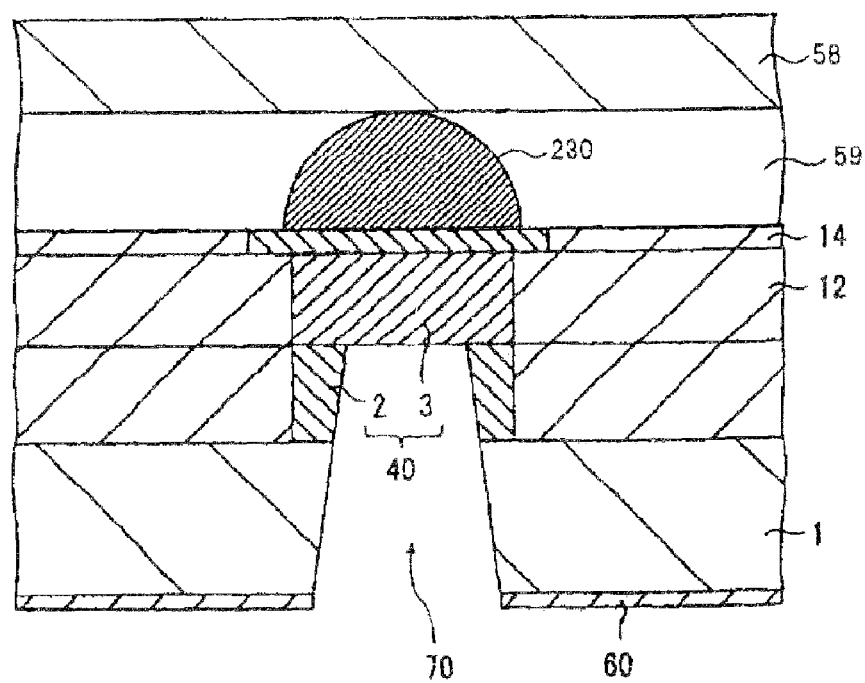
FIG. 7 is a schematic cross-sectional view of a substantial part used to explain a step of forming a via hole penetrating through the semiconductor silicon layer and reaching to the second contact pad, from the rear surface side of the semiconductor silicon layer, which is one step of the method for manufacturing the semiconductor device of the present invention.

FIG. 7 is a schematic cross-sectional view of a substantial part used to explain a step of forming via hole 70 penetrating through insulating layer 60, semiconductor silicon layer 1 and polysilicon contact pad 2 and reaching to metal contact pad 3, from the rear surface side of semiconductor silicon layer 1. As shown in FIG. 7, a photoresist layer is first formed over the front surface of insulating layer 60, i.e., the rear surface side of semiconductor silicon layer 1 (not illustrated).

An opening pattern is formed in this photoresist layer by a publicly-known lithography method. Using this opening pattern as a mask, insulating layer 60, semiconductor silicon layer 1 and polysilicon contact pad 2 are successively removed by anisotropic etching, such as an RIE (Reactive Ion Etching) method, to form via hole 70.

If anisotropic etching is performed using a fluorine-containing gas or the like (for example, $SF_6$) when carrying out this RIE method, metal contact pad 3 works as an etching stopper. Consequently, the progress of the anisotropic etching slows down as soon as metal contact pad 3 is exposed and, therefore, the etching is stopped at this moment. In this process, both semiconductor silicon layer 1 and polysilicon pad 2 are made of a silicon material and, therefore, can be removed in a single-step process. Thus, it is possible to form via hole 70 in a simplified manner.

Figure 8:
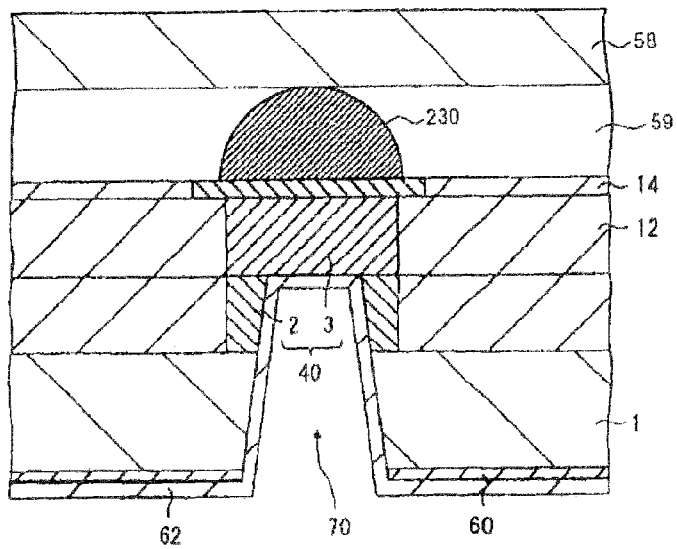
FIG. 8 is a schematic cross-sectional view of a substantial part used to explain a step of forming an insulating layer inside the via hole, which is one step of the method for manufacturing the semiconductor device of the present invention.

FIG. 8 is a schematic cross-sectional view of a substantial part used to explain a step of forming insulating layer 62 inside via hole 70. As insulating layer 62, there can be mentioned, for example, an insulating layer made of silicon nitride. This insulating layer 62 made of silicon nitride is deposited all over the rear surface side of semiconductor silicon layer 1 while covering insulating layer 60 using, for example, a plasma CVD method. Insulating layer 62 can be formed using, for example, silane and ammonia as raw material gases. The film thickness of this silicon nitride is normally in the range from 1.0 to 5.0 µm.

Figure 9:
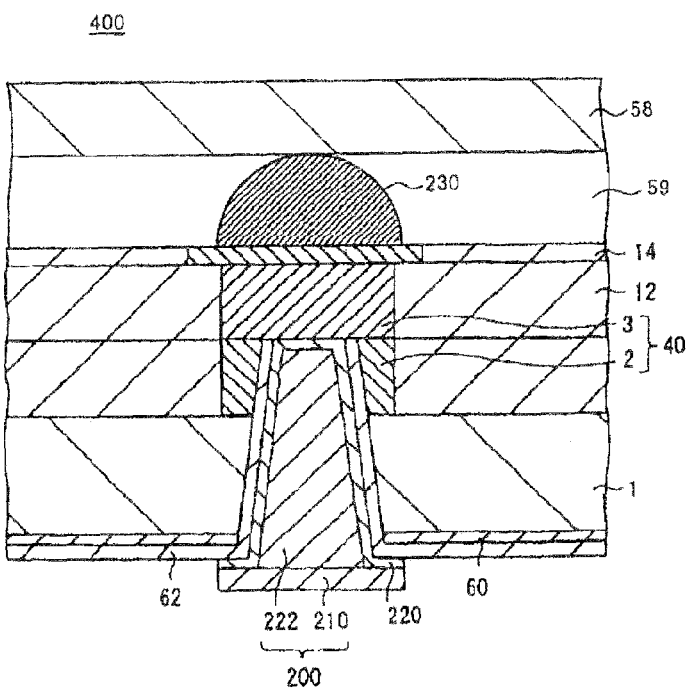
FIG. 9 is a schematic cross-sectional view of a substantial part used to explain a step of forming a through-hole electrode inside the via hole, which is one step of the method for manufacturing the semiconductor device of the present invention.

FIG. 9 is a schematic cross-sectional view of a substantial part used to explain a step of forming a through-hole electrode inside via hole 70. As shown in FIG. 9, insulating layer 62 in the bottom face of via hole 70 is etched back and thereby removed, so as to expose part of metal contact pad 3 in the bottom of via hole 70 (see FIG. 8).

Subsequently, through-hole electrode 200 is formed inside via hole 70. This through-hole electrode 200 includes internal through-hole electrode 222 and electrode pad 210. This internal through-hole electrode 222 is made of one of or two or more of metals, including copper, aluminum, titanium and tungsten, metal silicides, including titanium silicide and tungsten silicide, conductive inorganic materials, including titanium nitride, and polysilicon and the like containing an n-type impurity such as phosphorous or a p-type impurity such as boron. Internal through-hole electrode 222 is preferably made of metal such as titanium, copper or the like.

The metal material of electrode pad 210 formed in the lower portion of this internal through-hole electrode 222 is determined according to the metal material of bump 230 connected to this electrode pad when mounting semiconductor silicon layers in a multilayered manner. If the metal material of bump 230 to be connected is, for example, the above-described tin-silver-copper alloy, then a nickel-gold alloy or a copper-gold alloy is used as the metal material of electrode pad 210. If the metal material of bump 230 to be connected is a tin-silver-nickel-copper alloy, then a nickel-gold alloy is used as the metal material of electrode pad 210. The above-described metal materials of electrode pad 210 and bump 230 are interchangeable. In addition, this electrode pad 210 can be formed by a lithography method.

Hereinafter, a step of forming through-hole electrode 200 will be described by taking as an example the case in which internal through-hole electrode 222 is made of copper. First, titanium and copper are successively deposited as seed film for plating 220 by a sputtering method or an MOCVD method over the front surface of insulating layer 62, i.e., over the rear surface side of semiconductor silicon layer 1.

After that, a photoresist layer (not illustrated) is formed. An opening pattern is formed in this photoresist layer by a publicly-known lithography method. Using this opening pattern as a mask, copper is buried inside via hole 70 by an electroplating method.

After that, the photoresist layer is separated and removed using, for example, an organic solvent such as acetone. Then, excess copper and titanium of the seed film for plating are removed by a wet etching step using sulfuric acid or fluorinated acid. After going through the above-described steps, it is possible to form through-hole electrode 200 which includes internal through-hole electrode 222 and electrode pad 210, as shown in FIG. 9.

Next, a dicing sheet (not illustrated) is bonded onto the rear surface of semiconductor silicon layer 1 including electrode pad 210. Subsequently, after removing support medium 58 made of quartz, a processed semiconductor silicon wafer obtained by going through the above-described steps is diced by a publicly-known dicing step and the dicing sheet is removed.

By going through the above-described steps, it is possible to obtain semiconductor device 400 from which support medium 58 and adhesive agent 59 have been removed.

Next, an explanation will be made in more detail of cases in which manufacturing methods of the present invention are applied to a DRAM (Dynamic Random Access Memory) device by referring to the exemplary embodiments described below. However, the manufacturing methods of the present invention are not limited to cases in which the methods are applied to a DRAM device.

Third Exemplary Embodiment

Figure 10:
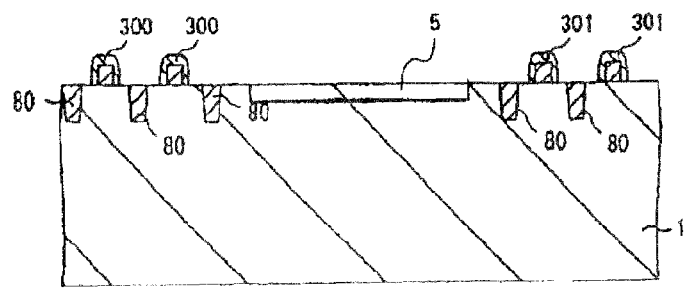
FIG. 10 is a schematic cross-sectional view of a substantial part used to explain one step of a method for manufacturing a semiconductor device used as a DRAM device which is a first exemplary embodiment of the present invention.

The present exemplary embodiment is directed at manufacturing a semiconductor device basically using the manufacturing method of the first embodiment. FIG. 10 is a schematic cross-sectional view of a substantial part used to explain a step of manufacturing a semiconductor device used as a DRAM device which is the present embodiment.

As shown in FIG. 10, an isolation region 80 referred to as an STI (shallow trench isolation) is first formed in the front surface region of semiconductor silicon layer 1. Subsequently, field-effect transistors 300 and 301 are formed as semiconductor elements over the front surface of semiconductor silicon layer 1 by a publicly-known lithography step, etching step and the like.

Here, if a semiconductor silicon layer containing a p-type impurity such as boron is used as semiconductor silicon layer 1, then n-type conduction-preventing impurity region 5 is formed (by, for example, high-concentration As ion implantation) in the front surface of this p-type semiconductor silicon layer 1 along with the formation of field-effect transistors 300 and 301. This n-type conduction-preventing impurity region 5 is formed so as to include a zone of contact between the front surface of p-type semiconductor silicon layer 1 and polysilicon contact pad 2 (to be formed later). This n-type conduction-preventing impurity region 5 is provided in order to prevent conduction between a signal (at an amplitude between, for example, ±1.5 V and a ground potential) transferred through later-formed conductive pad 40 and semiconductor silicon layer 1 (at, for example, the ground potential) by forming a pn junction between the impurity region and p-type semiconductor silicon layer 1.

N-type conduction-preventing impurity region 5 is preferably formed at the same time the source/drain regions of field-effect transistors 300 and 301 are formed. It is also possible, however, to form the source/drain regions of field-effect transistors 300 and 301 in a separate step.

Alternatively, if a semiconductor silicon layer containing an n-type impurity such as phosphorous is used as semiconductor silicon layer 1, then conduction-preventing impurity region 5 formed in the front surface of n-type semiconductor silicon layer 1 is specified as a p-type conduction-preventing impurity region.

In a DRAM device, there is generally formed a memory array in which several hundreds of thousands to several tens of millions of memory cells are arranged in an orderly manner. In addition, there are formed a peripheral circuit and the like for inputting/outputting signals to/from each memory cell, so as to surround the memory array. Field-effect transistor 300 composes each of these memory cells and field-effect transistor 301 composes the peripheral circuit. The configuration and the manufacturing method of the memory array and peripheral circuit are publicly known. Thus, the field-effect transistors 300 and 301 can be formed according to the publicly-known manufacturing method.

Figure 11:
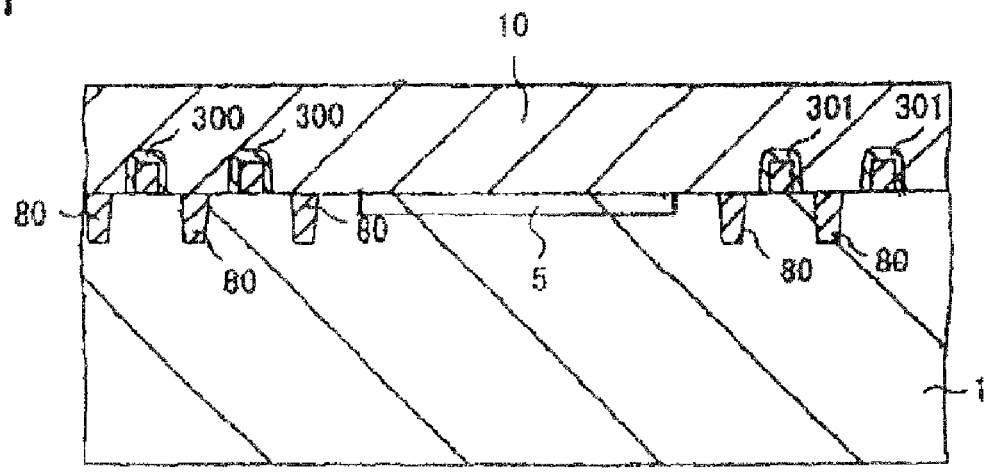
FIG. 11 is a schematic cross-sectional view of a substantial part used to explain a step of forming an interlayer insulating film over a semiconductor silicon layer, which is one step of the method for manufacturing the semiconductor device of the present invention.

Subsequently, as shown in FIG. 11, interlayer insulating film 10 made of oxide silicon is formed over semiconductor silicon layer 1 and field-effect transistors 300 and 301 by a plasma CVD method using, for example, ozone ($O_3$) and tetraethoxysilane (TEOS) as raw material gases.

Subsequently, a photoresist layer (not illustrated) is formed over a surface of interlayer insulating film 10. An opening pattern is formed in this photoresist layer by a publicly-known lithography method. Using this opening pattern as a mask, an opening is formed in interlayer insulating film 10. Next, after removing the photoresist layer by an ashing step or the like, polysilicon is deposited over the entire surface of interlayer insulating film 10 including this opening by, for example, a CVD method. The film thickness of this polysilicon is normally in the range from 0.5 to 1.5 μm. The deposition of this polysilicon is performed using, for example, a low-pressure CVD apparatus. Phosphine ($PH_3$) is supplied simultaneously as a raw material gas, in addition to silane, to make polysilicon contain phosphorous as an impurity. The polysilicon film formed at a temperature of 580° C. or higher is in a polycrystalline state and exhibits conductive properties since the film is fully doped with phosphorous.

Figure 12:
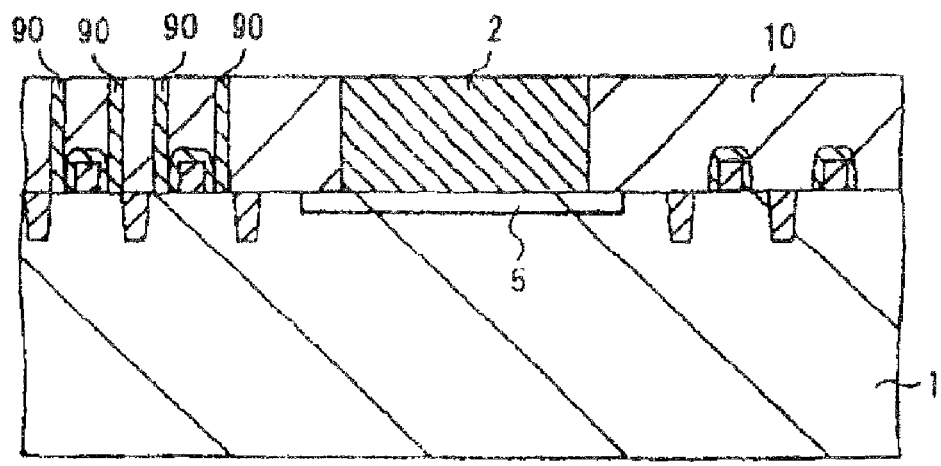
FIG. 12 is a schematic cross-sectional view of a substantial part used to explain a step of forming a first contact pad 2 and a first contact 90 to be electrically connected to a capacitive element and the like formed in a memory cell array, which is one step of the method for manufacturing the semiconductor device of the present invention.

Next, unnecessary polysilicon over the upper surface of interlayer insulating film 10 is removed by a CMP step or the like and the upper surface is planarized. With this step, it is possible to form a first contact pad 2 and a first contact (also referred to as a cell contact) 90 to be electrically connected to a capacitive element and the like formed in a memory cell array, as shown in FIG. 12.

While an explanation has been made of a step of forming first contact 90 and polysilicon contact pad 2 based over a single-step process from a step of forming the photoresist layer to a CMP step or the like, these steps are not limited to a single-step process but can be carried out as a multistep process.

For example, after carrying out the above-described process from the step of forming the photoresist layer to the CMP step or the like, an interlayer insulating film made of oxide silicon or the like is once again formed over the upper surface of interlayer insulating film 10. Then, the above-described process from the step of forming the photoresist layer to the CMP step or the like is repeated. Thus, it is possible to successively form a cell contact and a polysilicon contact pad made of multilayer polysilicon (not illustrated). Polysilicon contact pad 2 formed in this step can be formed simultaneously with the step of forming first contact 90.

Figure 13:
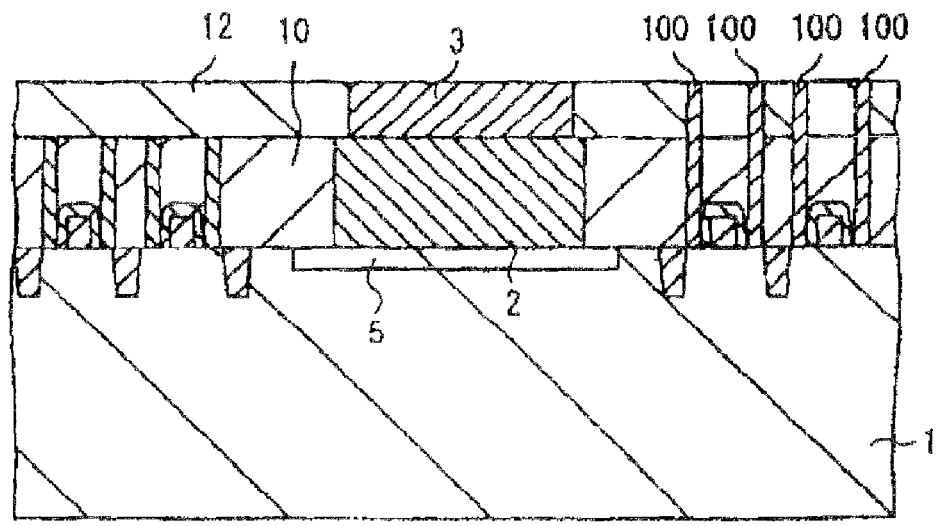
FIG. 13 is a schematic cross-sectional view of a substantial part used to explain a step of forming a second contact pad and a second contact 100 to be connected to a peripheral circuit, which is one step of the method for manufacturing the semiconductor device of the present invention.

FIG. 13 is a schematic cross-sectional view of a substantial part used to explain a step of forming a second contact pad 3 and a second contact 100 to be connected to a peripheral circuit on the upper surface of semiconductor silicon layer 1. After forming interlayer insulating film 12 made of oxide silicon or the like over the upper surface of interlayer insulating film 10 by a plasma CVD method or the like to a thickness of approximately 0.1 to 1.0 μm, a photoresist layer (not illustrated) is formed over a surface of interlayer insulating film 12.

An opening pattern is formed in this photoresist layer by a publicly-known lithography method. Using this opening pattern as a mask, openings for second contact 100 and metal contact pad 3 are formed in interlayer insulating film 12. Here, an opening for second contact 100 is formed so as to extend to interlayer insulating film 10. After removing the photoresist layer by an ashing step or the like, such metal as tungsten is deposited inside the opening by an MOCVD method. The film thickness of this tungsten is normally in the range from 0.2 to 1.0 μm.

Next, unnecessary tungsten over the upper surface of interlayer insulating film 12 is removed by a CMP step or the like and the upper surface is planarized. With this step, it is possible to form second contact 100 to be connected to a peripheral circuit, as shown in FIG. 13.

Metal contact pad 3 formed in this step is formed simultaneously with a step of forming a conductive material plug for burying second contact 100 to be connected to a peripheral circuit.

Figure 14:
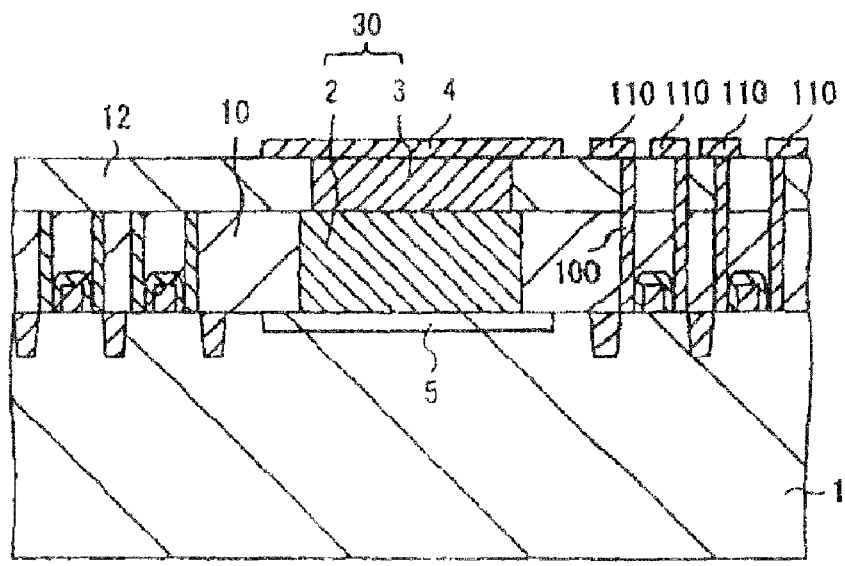
FIG. 14 is a schematic cross-sectional view of a substantial part used to explain a step of forming a metal interconnect layer over the upper surface of the second contact pad, which is one step of the method for manufacturing the semiconductor device of the present invention.

FIG. 14 is a schematic cross-sectional view of a substantial part used to explain a step of forming metal interconnect layer 4 over the upper surface of metal contact pad 3. First, such metal as tungsten is deposited by an MOCVD method over the entire surface of the semiconductor device including interlayer insulating film 12, second contact 100 buried using the conductive material plug, and metal contact pad 3. Next, the tungsten film is subjected to patterning using a publicly-known lithography method to form metal interconnect layer 4 and metal pad 110.

Here, it is possible to configure the semiconductor device in such a manner that bump 230 is formed in contact with a surface of metal interconnect layer 4 over conductive pad 40. In this case, bump 230 is formed using solder made of, for example, a tin-silver-copper alloy.

Figure 15:
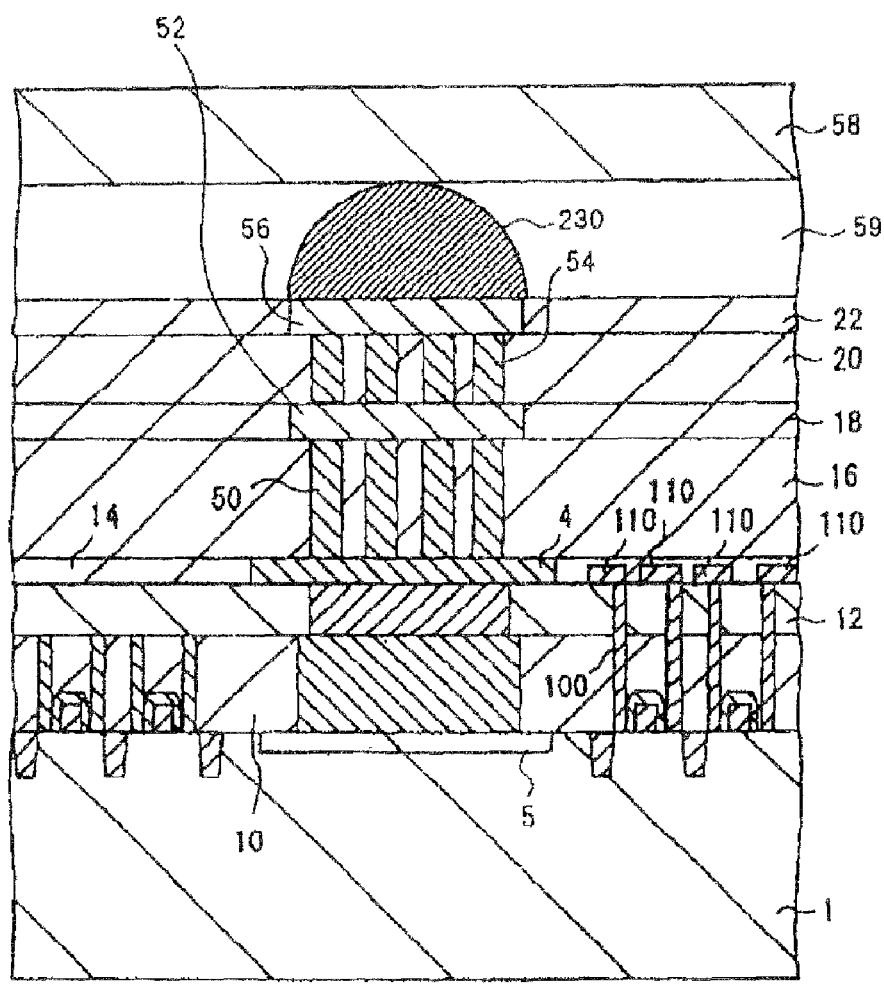
FIG. 15 is a schematic cross-sectional view of a substantial part used to explain a step of forming an upper interconnect structure and a bump over the metal interconnect layer, which is one step of the method for manufacturing the semiconductor device of the present invention.

An explanation will be made of a case here, however, in which an upper interconnect structure and bump 230 are formed over metal interconnect layer 4. FIG. 15 is a schematic cross-sectional view of a substantial part used to explain a step of forming an upper interconnect structure and bump 230 over metal interconnect layer 4.

First, interlayer insulating film 14 made of oxide silicon or the like is formed over metal interconnect layer 4 by means of, for example, a plasma CVD method. Then, the upper portion of interlayer insulating film 14 is planarized by a CMP method or the like.

Next, after forming interlayer insulating film 16 made of oxide silicon or the like in the upper portion of interlayer insulating film 14 by means of a plasma CVD method, the upper surface of interlayer insulating film 16 is planarized by a CMP method or the like. After this, a photoresist layer (not illustrated) is formed over the upper surface of interlayer insulating film 16. An opening pattern is formed in this photoresist layer by a publicly-known lithography method. Using this opening pattern as a mask, an opening is formed in interlayer insulating film 16. By depositing such metal as tungsten inside this opening by, for example, an MOCVD method, it is possible to form first contact for external connection 50 to be electrically connected to metal interconnect layer 4.

In an example of modification of this step of forming first contact for external connection 50, a metal layer is first formed by depositing such metal as tungsten by an MOCVD method, and then the metal layer is subjected to patterning using a publicly-known lithography method. After this, an interlayer insulating film made of, for example, oxide silicon is deposited by a plasma CVD method or the like. Thus a first contact for external connection 50 can be also formed. The same also holds true for a second contact for external connection and the like described hereinafter.

Subsequently, after planarizing the upper surfaces of first contact for external connection 50 and interlayer insulating film 16 by a CMP method or the like, interlayer insulating film 18 made of oxide silicon or the like is formed over first contact for external connection 50 and interlayer insulating film 16 by means of, for example, a plasma CVD method.

Subsequently, a photoresist layer (not illustrated) is formed over the upper surface of interlayer insulating film 18. An opening pattern is formed in this photoresist layer by a publicly-known lithography method. Using this opening pattern as a mask, an opening is formed in interlayer insulating film 18. After forming a metal barrier film made of, for example, titanium nitride (not illustrated) inside this opening by a sputtering method or the like, aluminum or an aluminum alloy, such as an aluminum-silicon-copper alloy, is deposited over the metal barrier film by a sputtering method or the like. A metal barrier film made of, for example, titanium nitride is further formed over the aluminum or aluminum-alloy layer by a sputtering method or the like, thereby forming first aluminum interconnect 52.

Furthermore, after forming second contact for external connection 54 by the same method as the above-described method for forming first contact for external connection 50, second aluminum interconnect 56 is formed by the same method as the above-described method for forming first aluminum interconnect 52.

With the above-described steps, it is possible to form an electrode for external connection comprised of part of second aluminum interconnect 56 over metal interconnect layer 4 shown in FIG. 15.

Interlayer insulating films 18, 20 and 22 made of oxide silicon or the like can be formed in the same way as above-described interlayer insulating film 10 and the like. In addition, a capacitive contact, a capacitor and the like, though not particularly shown in FIG. 15, are formed within the interlayer insulating film. Next, bump 230 is formed using solder made of, for example, a tin-silver-copper alloy.

The semiconductor device is configured in such a manner that bump 230 is formed in contact with a surface of the electrode for external connection formed of part of second aluminum interconnect 56. In this case, bump 230 is formed using solder made of, for example, a tin-silver-copper alloy. A material for forming bump 230 is not limited to solder but the bump may be formed using, for example, conductive paste.

Furthermore, as shown in FIG. 15, support medium 58 made of quartz is bonded onto interlayer insulating film 22 using adhesive agent 59, in order to protect the outermost surface of the semiconductor device, including bump 230. By bonding this support medium 58, it is possible to prevent any damage from occurring on the front surface side of semiconductor silicon layer 1 when carrying out a step of processing the rear surface thereof to be described hereinafter.

Figure 16:
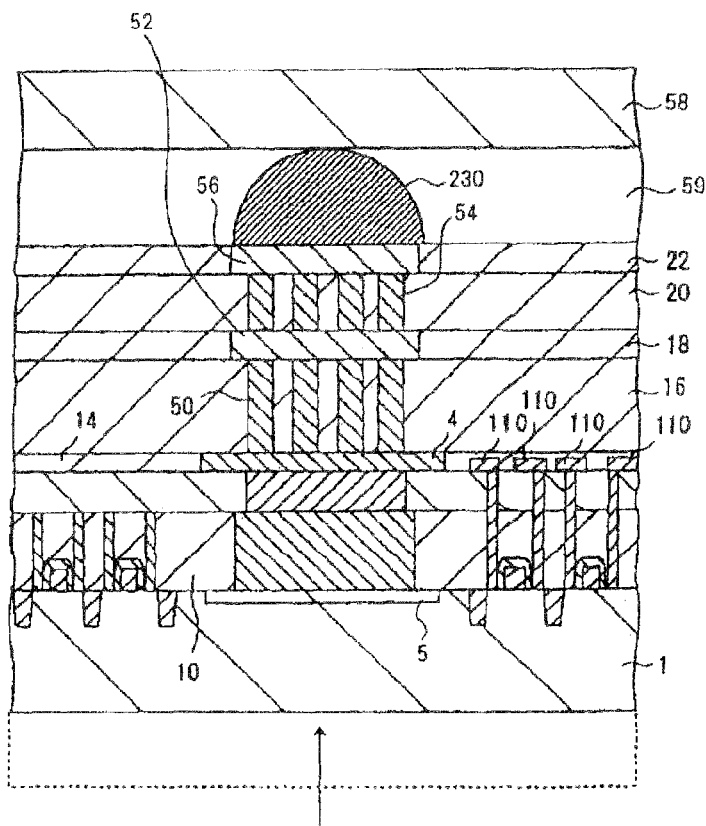
FIG. 16 is a schematic cross-sectional view of a substantial part used to explain a step of polishing the rear surface of the semiconductor silicon layer, which is one step of the method for manufacturing the semiconductor device of the present invention.

Next, a step of processing the rear surface of semiconductor silicon layer 1 will be described. FIG. 16 is a schematic cross-sectional view of a substantial part used to explain a step of polishing the rear surface of semiconductor silicon layer 1.

In this step, the thickness of semiconductor silicon layer 1 is adjusted to within 10 to 150 μm by polishing the rear surface thereof. This polishing step is not limitative but can be carried out by selecting a publicly-known method as appropriate.

Figure 17:
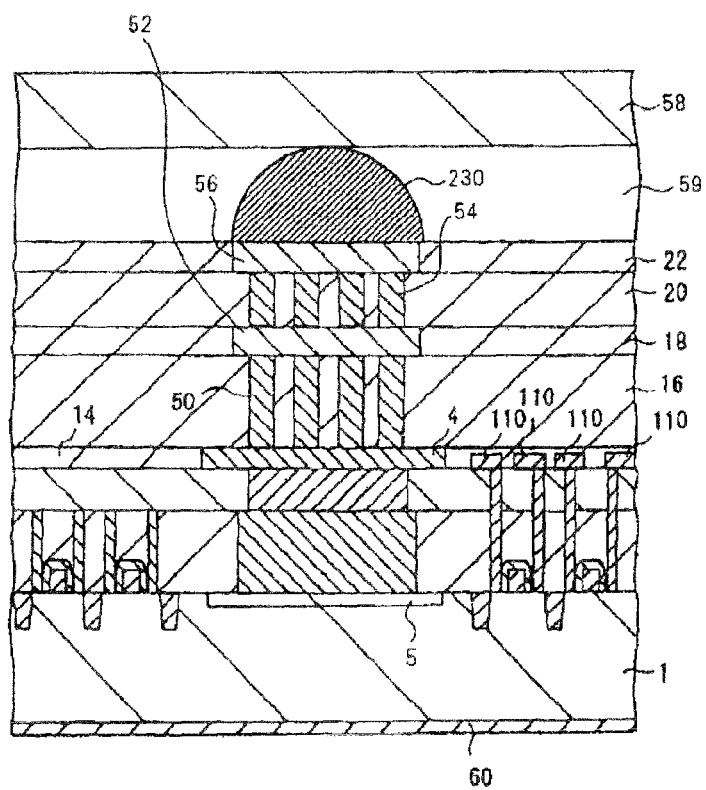
FIG. 17 is a schematic cross-sectional view of a substantial part used to explain a step of forming an insulating layer over the rear surface of the semiconductor silicon layer which is one step of the method for manufacturing the semiconductor device of the present invention.

FIG. 17 is a schematic cross-sectional view of a substantial part used to explain a step of forming an insulating layer over the rear surface of semiconductor silicon layer 1. As shown in FIG. 17, it is possible to form insulating layer 60 by depositing oxide silicon over the rear surface of semiconductor silicon layer 1 by a plasma CVD method. The thickness of this insulating film 60 is normally in the range from 0.1 to 1 μm.

Figure 18:
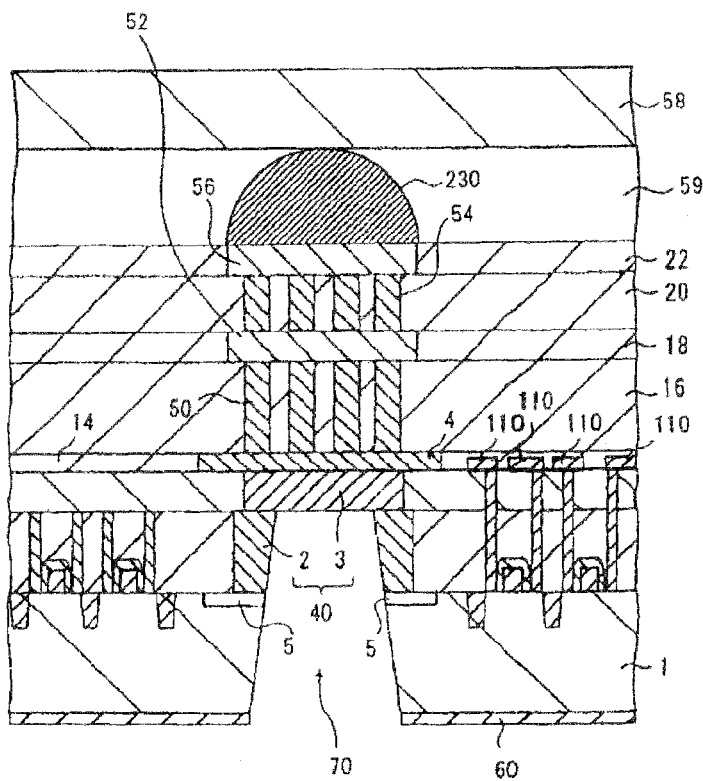
FIG. 18 is a schematic cross-sectional view of a substantial part used to explain a step of forming a via hole penetrating through the semiconductor silicon layer and reaching to the second contact pad, from the rear surface side of the semiconductor silicon layer, which is one step of the method for manufacturing the semiconductor device of the present invention.

FIG. 18 is a schematic cross-sectional view of a substantial part used to explain a step of forming via hole 70 penetrating through insulating layer 60, semiconductor silicon layer 1 (part of which is n-type conduction-preventing impurity region 5) and polysilicon contact pad 2 and reaching to metal contact pad 3, from the rear surface side of semiconductor silicon layer 1. First, a photoresist layer (not illustrated) is formed over the front surface of insulating layer 60, i.e., over the rear surface side of semiconductor silicon layer 1.

Next, an opening pattern is formed in this photoresist layer by a publicly-known lithography method. Using this opening pattern as a mask, insulating layer 60, semiconductor silicon layer 1 (part of which is n-type conduction-preventing impurity region 5), and polysilicon contact pad 2 are successively etched away, in order to form via hole 70. This via hole 70 can be formed by anisotropic etching such as reactive ion etching.

More specifically insulating layer 60 can be etched away by an RIE (reactive ion etching) method using a gas composed primarily of, for example, a fluorocarbon such as $CHF_3$. In addition, semiconductor silicon layer 1 (part of which is n-type conduction-preventing impurity region 5) and polysilicon contact pad 2 can be removed by performing etching based on an RIE method at a temperature of −50 to +25° C., a pressure of 0.1 to 10 mmTorr, a high-frequency power of 500 to 2000 W and a bias power of 100 to 500 W under the presence of a fluorine-containing gas (for example, $SF_6$).

At this time, earlier-formed metal contact pad 3 (tungsten) functions as an etching stopper. Consequently, the progress of the anisotropic etching slows down as soon as this metal contact pad 3 is exposed by etching on the rear surface side of semiconductor silicon layer 1 and, therefore, the etching is stopped at this moment. Thus, via hole 70 can be formed. The outer diameter of via hole 70 thus obtained is normally in the range from 5 to 100 μm.

In the present exemplary embodiment, first contact pad 2 is a polysilicon contact pad made of polysilicon. Accordingly, it is possible to etch semiconductor silicon layer 1 and the polysilicon contact pad continuously in a single step without changing the etching conditions. By composing first contact pad 2 of the same material as that of semiconductor silicon layer 1 as described above, it is possible to easily create the via hole without going through such complicated steps as described in Japanese Patent Laid-Open No. 2005-93486 until the metal of second contact pad 3 serving as an etching stopper is exposed.

Figure 19:
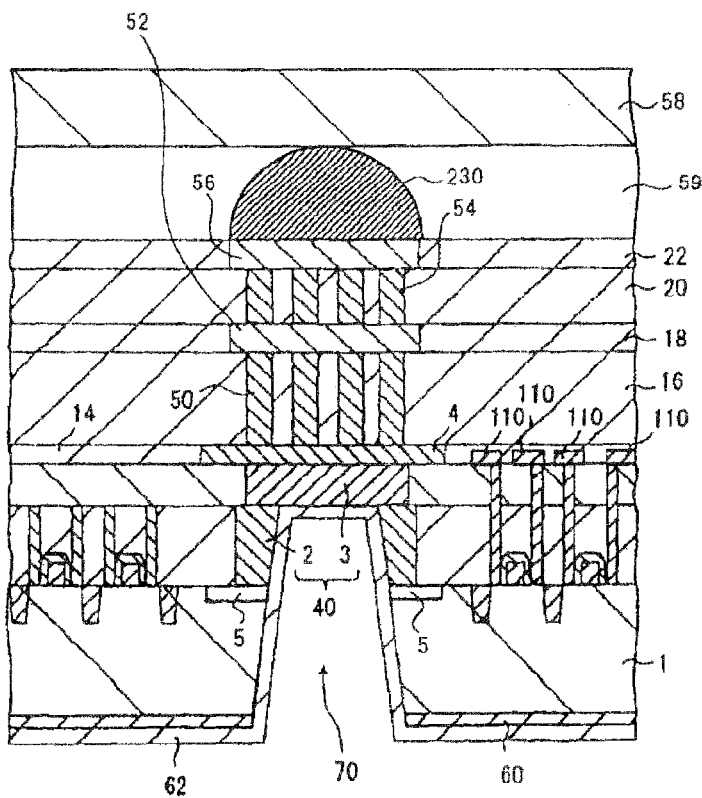
FIG. 19 is a schematic cross-sectional view of a substantial part used to explain a step of forming an insulating layer inside the via hole, which is one step of the method for manufacturing the semiconductor device of the present invention.

FIG. 19 is a schematic cross-sectional view of a substantial part used to explain a step of forming insulating layer 62 inside via hole 70. This insulating layer 62 is formed of silicon nitride and is deposited over the entire rear surface of semiconductor silicon layer 1 while covering insulating layer 60. This insulating layer 62 made of silicon nitride is usually deposited using a plasma CVD method. By using, for example silane and ammonia as raw material gases, an insulating layer 62 made of silicon nitride can be formed as shown in FIG. 19. The film thickness of this silicon nitride is normally in the range from 1.0 to 5.0 μm.

Figure 20:
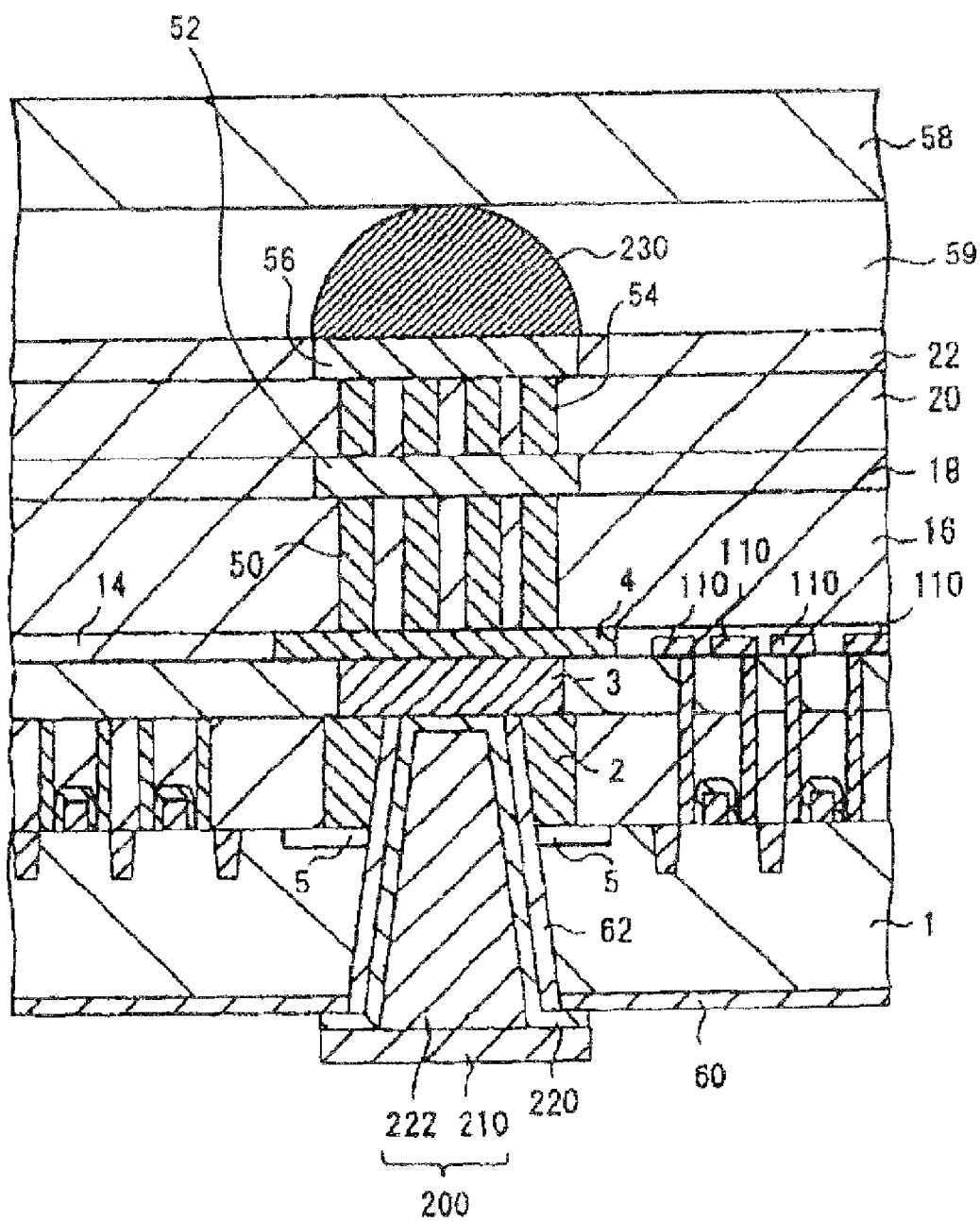
FIG. 20 is a schematic cross-sectional view of a substantial part used to explain a step of forming a through-hole electrode inside the via hole, which is one step of the method for manufacturing the semiconductor device of the present invention.

FIG. 20 is a schematic cross-sectional view of a substantial part used to explain a step of forming through-hole electrode 200 inside via hole 70. Next, insulating layer 62 is etched back and a portion thereof in the bottom face of via hole 70 is removed to expose metal contact pad 3.

Subsequently, an approximately 0.1 to 0.5 μm-thick film of titanium and an approximately 0.2 to 1.0 μm-thick film of copper are successively deposited as seed film for plating 220 by a sputtering method or an MOCVD method over the front surface of insulating layer 62, i.e., over the rear surface side of semiconductor silicon layer 1. This seed film for plating 220 works as a power-feeding film when a film of copper is formed by an electroplating method in a subsequent step.

After this, a photoresist layer is formed (not illustrated). An opening pattern is formed in this photoresist layer by a publicly-known lithography method. Using this opening pattern as a mask, copper to serve as internal through-hole electrode 222 is buried inside via hole 70 by an electroplating method.

This burial of copper by plating can be performed by flowing a DC current or a pulse current through an electrolyte containing copper ions or copper complex ions, thereby precipitating copper on a cathode. In the present exemplary embodiment, a copper sulfate solution is used as an electrolysis solution, the seed film for plating is used as a cathode, an anodic electrode is placed in the copper sulfate solution, and a DC current is flowed through the anodic electrode. The film thickness of copper thus obtained is normally 10 to 50 μm.

After this, the photoresist layer is separated and removed using acetone, and then excess copper and titanium of the seed film for plating is removed by a wet etching step using sulfuric acid or fluorinated acid. Then, electrode pad 210 made of the above-described metal material is formed under internal through-hole electrode 222 by a lithography method or the like.

With the above-described steps, it is possible to obtain a semiconductor device including through-hole electrode 200 shown in FIG. 20. As shown in FIG. 20, through-hole electrode 200 thus formed is composed of internal through-hole electrode 222 and electrode pad 210.

Figure 21:
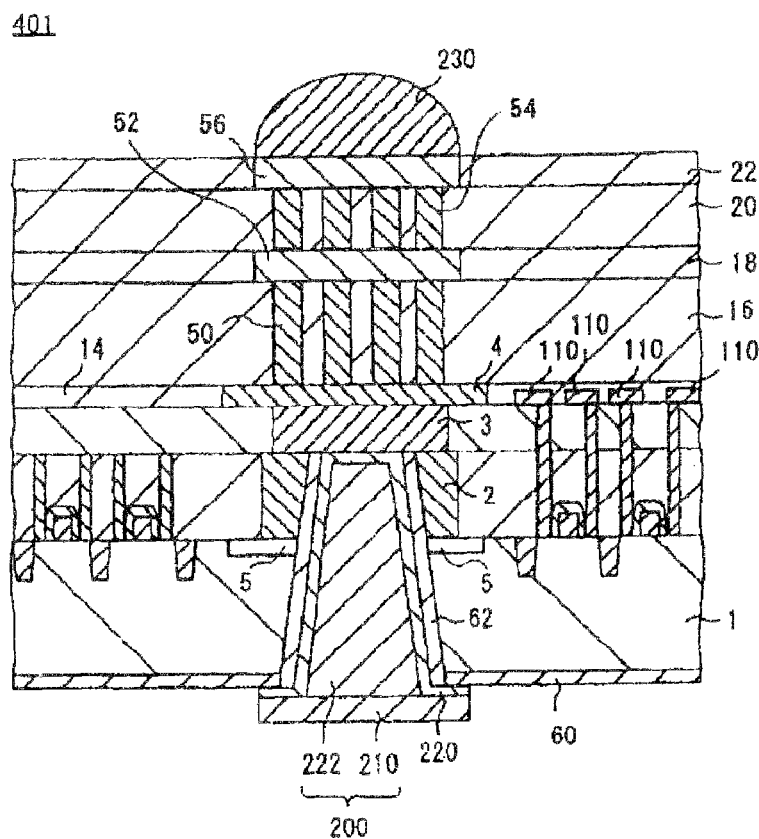
FIG. 21 is a schematic cross-sectional view of a substantial part of the semiconductor device obtained according to the first exemplary embodiment.

FIG. 21 is a schematic cross-sectional view of a substantial part of semiconductor device 401 obtained according to the first exemplary embodiment. First, a dicing sheet (not illustrated) is bonded onto the rear surface of semiconductor silicon layer 1 including electrode pad 210. Subsequently, after removing support medium 58 made of quartz and adhesive agent 59 (see FIG. 20), a processed semiconductor silicon wafer obtained by going through the above-described steps is diced by a publicly-known dicing step and the dicing sheet is removed.

With the above-described steps, a semiconductor device 401 can be manufactured.

Second Exemplary Embodiment

Figure 22:
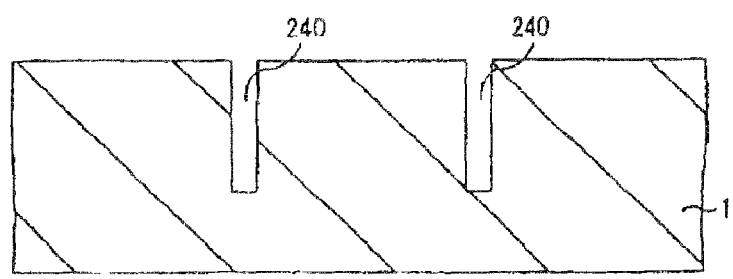
FIG. 22 is a schematic cross-sectional view of a substantial part used to explain one step of a method for manufacturing a semiconductor device which is a second exemplary embodiment of the present invention.

The present exemplary embodiment is directed at manufacturing a semiconductor device basically using the manufacturing method of the second embodiment. FIG. 22 is a schematic cross-sectional view of a substantial part used to explain a step of manufacturing a semiconductor device of the second embodiment. As shown in FIG. 22, cylindrical electrode/substrate-separating hole 240 is first formed from the front surface side of semiconductor silicon layer 1.

That is, a photoresist layer is first formed over the front surface side of semiconductor silicon layer 1 (not illustrated). An opening pattern is formed in this photoresist layer by a publicly-known lithography method. Using this opening pattern as a mask, cylindrical electrode/substrate-separating hole 240 is formed so as to surround a region of semiconductor silicon layer 1 in which a through-hole electrode is to be formed. Cylindrical electrode/substrate-separating hole 240 can be formed by, for example, anisotropic etching such as reactive ion etching. Conditions applied when carrying out this anisotropic etching can be the same as the conditions used to carry out reactive ion etching when forming via hole 70 in the first exemplary embodiment.

Figure 23:
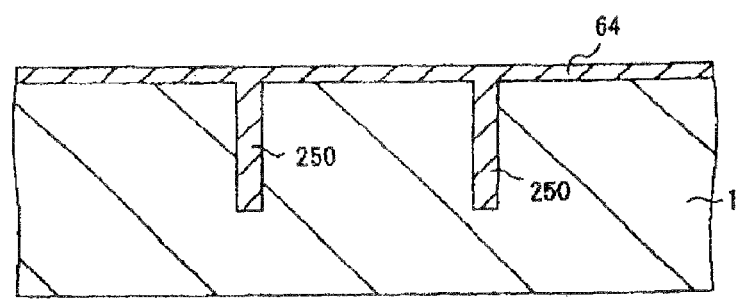
FIG. 23 is a schematic cross-sectional view of a substantial part used to explain a step of forming an outer-circumferentially cylindrical insulator by burying an insulating material in a cylindrical electrode/substrate-separating hole, which is one step of the method for manufacturing the semiconductor device of the present invention.

FIG. 23 is a schematic cross-sectional view of a substantial part used to explain a step of forming outer-circumferentially cylindrical insulator 250 by burying an insulating material in cylindrical electrode/substrate-separating hole 240. As shown in FIG. 23, the insulating material is buried in cylindrical electrode/substrate-separating hole 240. As this insulating material, there can be mentioned, for example, oxide silicon. This oxide silicon can be buried inside cylindrical electrode/substrate-separating hole 240 by a CVD method or the like. By burying this insulating material, an outer-circumferentially cylindrical insulator 250 can be formed. The thickness of this insulating film is normally in the range from 1.0 to 3.0 μm. Also at this time, insulating layer 64 made of oxide silicon is formed over the front surface of semiconductor silicon layer 1 by a CVD method or the like.

Figure 24:
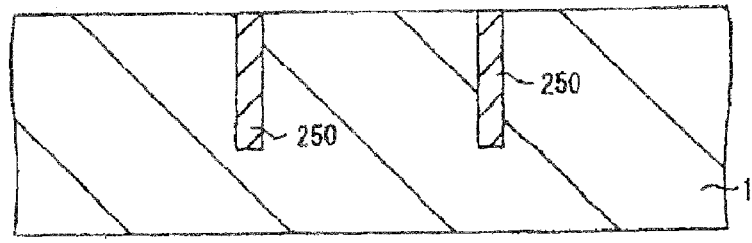
FIG. 24 is a schematic cross-sectional view of a substantial part used to explain a step of removing an insulating film made of oxide silicon formed over a surface of a semiconductor silicon layer, which is one step of the method for manufacturing the semiconductor device of the present invention.

FIG. 24 is a schematic cross-sectional view of a substantial part used to explain a step of removing insulating layer 64 made of oxide silicon formed over a surface of semiconductor silicon layer 1. As shown in FIG. 24, the insulating layer 64 is removed by a wet etching step using fluorinated acid and by a CMP step, the surface of semiconductor silicon layer 1 can be planarized. With this step, the surface of semiconductor silicon layer 1 can be also exposed. Outer-circumferentially cylindrical insulator 250 thus formed in semiconductor silicon layer 1 surrounds a region thereof in which a through-hole electrode is to be formed in a subsequent step. In addition, the outer-circumferentially cylindrical insulator is formed so as to have contact with interlayer insulating film 10 to be formed in the next step.

Figure 25:
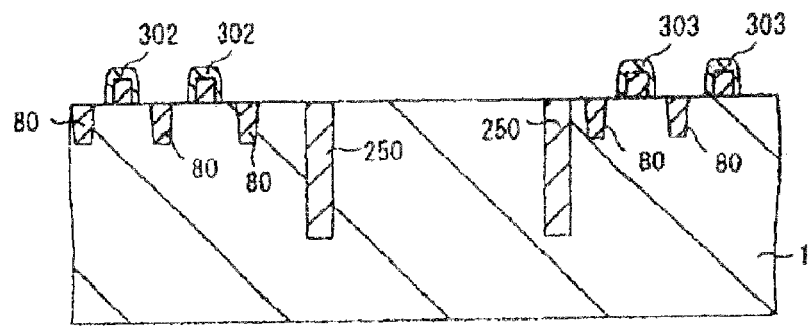
FIG. 25 is a schematic cross-sectional view of a substantial part used to explain a step of forming a field-effect transistor over the surface of the semiconductor silicon layer, which is one step of the method for manufacturing the semiconductor device of the present invention.

FIG. 25 is a schematic cross-sectional view of a substantial part used to explain a step of forming field-effect transistors 302 and 303 over a surface of semiconductor silicon layer 1. As in the case of the first exemplary embodiment, isolation region 80 referred to as an STI is first formed in the front surface region of semiconductor silicon layer 1. Subsequently, field-effect transistors 302 and 303 are formed by a publicly-known lithography step, an etching step and the like on the surface of semiconductor silicon layer 1, as shown in FIG. 25. Field-effect transistor 302 composes a memory cell as field-effect transistor 300 in the first exemplary embodiment, whereas field-effect transistor 303 composes a peripheral circuit as field-effect transistor 301 in the first exemplary embodiment.

In the first exemplary embodiment, n-type conduction-preventing impurity region 5 is formed at the same time when field-effect transistors 300 and 301 are formed In this second exemplary embodiment, however, there is no need to form n-type conduction-preventing impurity region 5 since outer-circumferentially cylindrical insulator 250 is formed.

Subsequently, the structure shown in FIG. 26 can be obtained by going through the same steps as those explained according to FIGS. 11 to 15 in the first exemplary embodiment.

Figure 26:
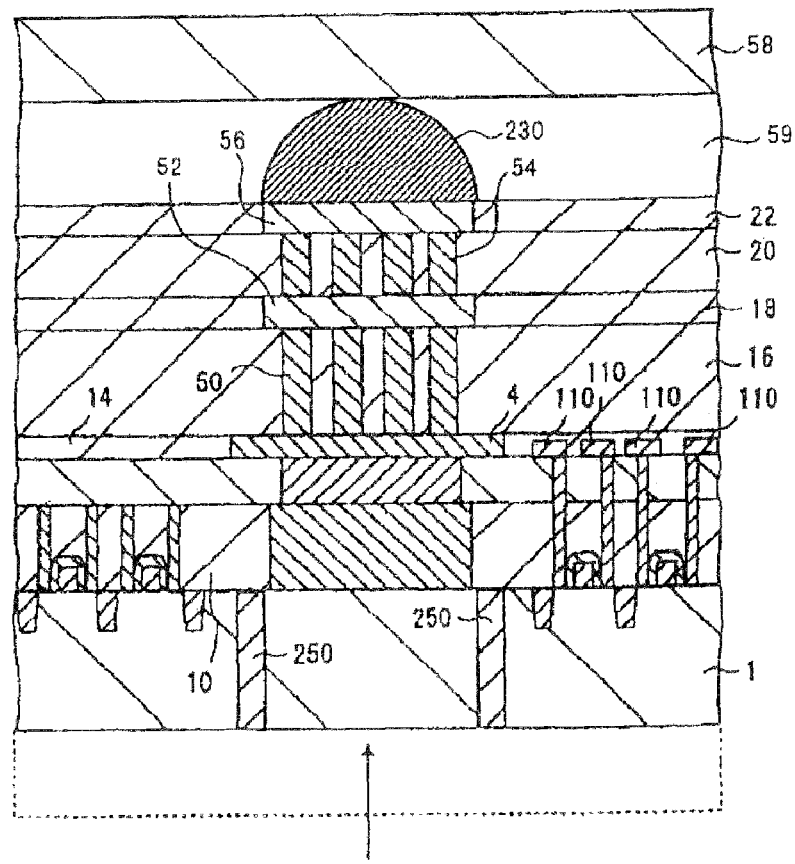
FIG. 26 is a schematic cross-sectional view of a substantial part used to explain a step of polishing the rear surface of the semiconductor silicon layer, which is one step of the method for manufacturing the semiconductor device of the present invention.

FIG. 26 is a schematic cross-sectional view of a substantial part used to explain a step of polishing the rear surface of semiconductor silicon layer 1. As in the case of the first exemplary embodiment, in FIG. 26, bump 230 is formed over an electrode for external connection composed of part of second aluminum interconnect 56 over the outermost surface above the front surface of semiconductor silicon layer 1. In order to protect this outermost surface, support medium 58 made of quartz is bonded using adhesive agent 59. It is possible to alternatively obtain a configuration in which bump 230 is formed in contact with a surface of metal interconnect layer 4 over conductive pad 40, without forming such an upper interconnect structure as shown in FIG. 26 over metal interconnect layer 4. Also the upper interconnect structure is not limited to the present exemplary embodiment but can be formed of a smaller number of interconnect layers or of a larger number of interconnect layers. Bump 230 is formed using solder made of, for example, a tin-silver-copper alloy. A material for forming bump 230 is not limited to solder but the bump may be formed using, for example, conductive paste.

Next, as shown in FIG. 26, the rear surface of semiconductor silicon layer 1 is polished by a polishing step, so that the thickness of semiconductor silicon layer 1 falls within the range from 10 to 150 μm. This polishing step is not limitative but can be carried out by selecting a publicly-known method as appropriate. With this polishing step, it is possible to expose the bottom face of outer-circumferentially cylindrical insulator 250 previously buried within semiconductor silicon layer 1. Also with this polishing step, it is possible to form, within semiconductor silicon layer 1, a region surrounded by outer-circumferentially cylindrical insulator 250 and electrically insulated from the rest of semiconductor silicon layer 1.

As described above, this second exemplary embodiment can include the steps of forming the cylindrical electrode/substrate-separating hole within semiconductor silicon layer 1 from the front surface side thereof; forming the outer-circumferentially cylindrical insulator by burying the insulating material in this cylindrical electrode/substrate separating hole; exposing the bottom of the outer-circumferentially cylindrical insulator by polishing the rear surface of the semiconductor silicon layer; and forming an insulated structure within the semiconductor silicon layer.

Figure 27:
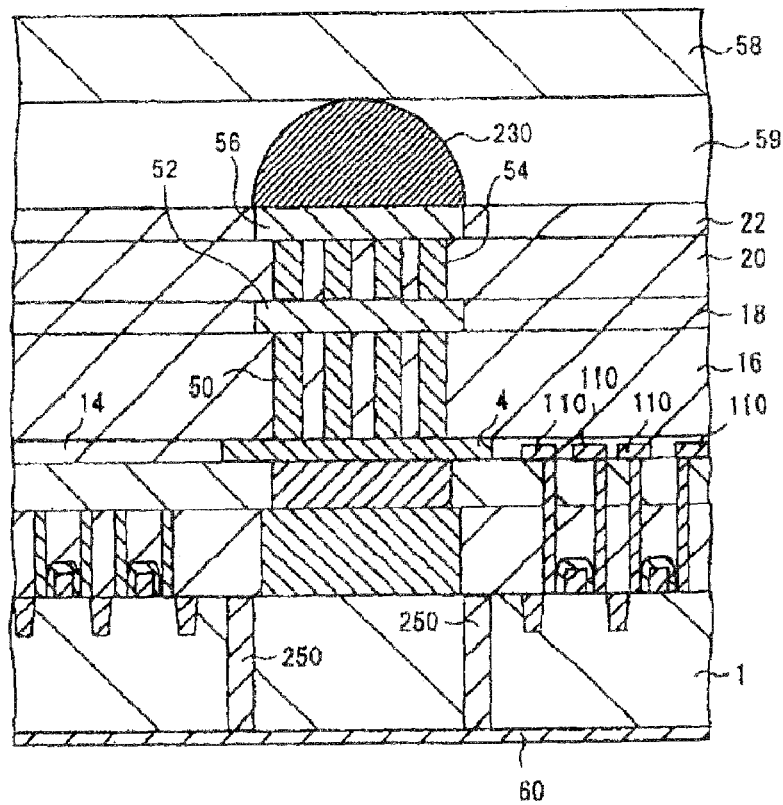
FIG. 27 is a schematic cross-sectional view of a substantial part used to explain a step of forming an insulating layer over the rear surface of the semiconductor silicon layer, which is one step of the method for manufacturing the semiconductor device of the present invention.

FIG. 27 is a schematic cross-sectional view of a substantial part used to explain a step of forming an insulating layer over the rear surface of semiconductor silicon layer 1. As shown in FIG. 27, it is possible to form insulating layer 60 by depositing oxide silicon over the rear surface of semiconductor silicon layer 1 using a plasma CVD method. The film thickness of this insulating layer 60 is normally in the range from 0.1 to 1 μm.

Figure 28:
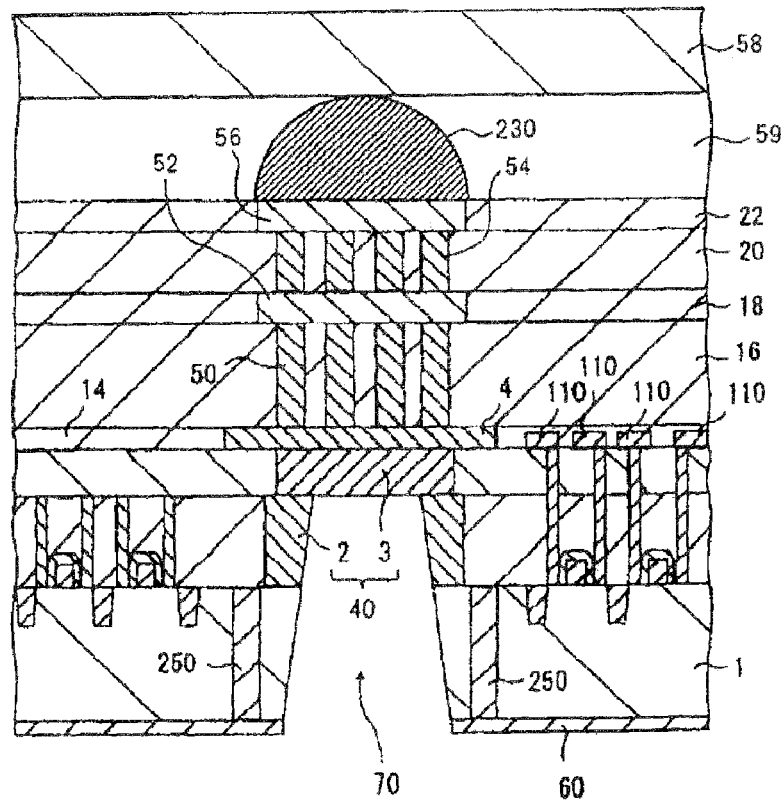
FIG. 28 is a schematic cross-sectional view of a substantial part used to explain a step of forming a via hole penetrating through the semiconductor silicon layer and reaching to the second contact pad, from the rear surface side of the semiconductor silicon layer, which is one step of the method for manufacturing the semiconductor device of the present invention.

FIG. 28 is a schematic cross-sectional view of a substantial part used to explain a step of forming via hole 70 penetrating through insulating layer 60, semiconductor silicon layer 1 and polysilicon contact pad (first contact pad) 2 and reaching to metal contact pad (second contact pad) 3, from the rear surface side of semiconductor silicon layer 1. First, a photoresist layer is formed over the front surface of insulating layer 60, i.e., over the rear surface side of semiconductor silicon layer 1 (not illustrated).

An opening pattern is formed in this photoresist layer by a publicly-known lithography method. Using this opening pattern as a mask, via hole 70 is formed inside outer-circumferentially cylindrical insulator 250, so as to penetrate through insulating layer 60, semiconductor silicon layer 1 and polysilicon contact pad 2. This via hole 70 can be formed by performing anisotropic etching using metal contact pad 3 as an etching stopper, as in the case of the above-described first exemplary embodiment. The outer diameter of via hole 70 thus obtained is normally in the range from 5 to 100 μm.

Also in the present exemplary embodiment, first contact pad 2 is a polysilicon contact pad made of polysilicon. Accordingly, it is possible to etch semiconductor silicon layer 1 and the polysilicon contact pad continuously in a single step without changing the etching conditions. By composing first contact pad 2 of the same material as that of semiconductor silicon layer 1 as described above, it is possible to easily create the via hole without going through such complicated steps as described in Japanese Patent Laid-Open No. 2005-93486 until the metal of second contact pad 3 serving as an etching stopper is reached.

Figure 29:
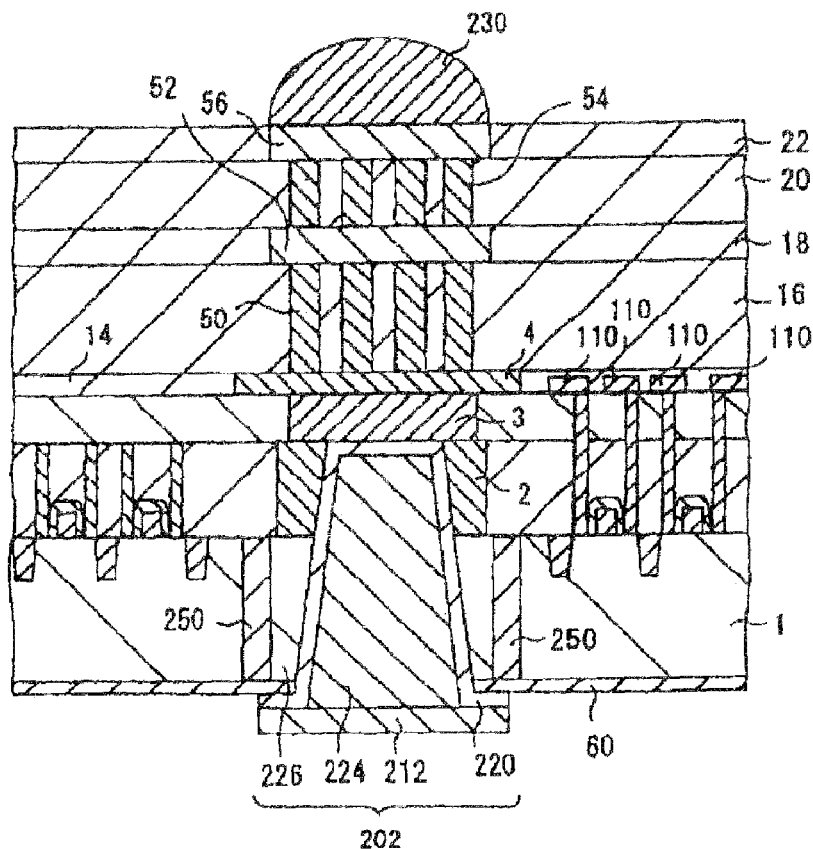
FIG. 29 is a schematic cross-sectional view of a substantial part used to explain a step of forming an internal through-hole electrode inside the via hole, which is one step of the method for manufacturing the semiconductor device of the present invention.

FIG. 29 is a schematic cross-sectional view of a substantial part used to explain a step of forming internal through-hole electrode 224 inside via hole 70. First, an approximately 0.1 to 0.5-μm thick film of titanium and an approximately 0.2 to 1.0 μm-thick film of copper are successively formed over the inner surface of via hole 70 as seed film for plating 220 by a sputtering method or an MOCVD method. This seed film for plating 220 works as a power-supplying film when forming the copper film by an electroplating method in a subsequent step.

After this, a photoresist layer is formed (not illustrated). An opening pattern is formed in this photoresist layer by a publicly-known lithography method. Using this opening pattern as a mask, copper to serve as internal through-hole electrode 224 is buried inside via hole 70 by an electroplating method. The film thickness of this copper is normally in the range from 10 to 50 μm.

After this, the photoresist layer is separated and removed using acetone. In addition, excess copper and titanium of seed film for plating 220 are removed by a wet etching method using sulfuric acid or fluorinated acid. Then, electrode pad 212 made of the same metal material as that of electrode pad 210 referred to in the above-described first exemplary embodiment is formed under internal through-hole electrode 224 by a lithography method or the like. With this step, it is possible to obtain a semiconductor device comprising through-hole electrode 202 including seed film 220, internal through-hole electrode 224, cylindrical semiconductor silicon 226, outer-circumferentially cylindrical insulator 250, and electrode pad 212, as shown in FIG. 29.

Subsequently, a dicing sheet (not illustrated) is bonded onto the rear surface of semiconductor silicon layer 1 including electrode pad 212. Then, after removing support medium 58 made of quartz and adhesive agent 59 (see FIG. 20), a processed semiconductor silicon wafer obtained by going through the above-described steps is diced by a publicly-known dicing step and the dicing sheet is removed. With the above-described steps, semiconductor device 402 can be manufactured.

In the case of through-hole electrode 200 included in semiconductor device 401 described according to the first exemplary embodiment, insulating layer 62 is disposed in contact with the inside of via hole 70. Furthermore, n-type conduction-preventing impurity region 5 is formed in a surface part of semiconductor silicon layer 1 in contact with polysilicon contact pad 2. In addition, a portion ranging from through-hole electrode 200 to bump 230 is electrically insulated from semiconductor silicon layer 1.

In contrast, semiconductor device 402 of the second exemplary embodiment differs from semiconductor device 401 in that through-hole electrode 202 is formed of seed film 220, internal through-hole electrode 224, cylindrical semiconductor silicon 226, outer-circumferentially cylindrical insulator 250 and electrode pad 212, and through-hole electrode 202 is electrically insulated from semiconductor silicon layer 1 by outer-circumferentially cylindrical insulator 250.

Figure 30:
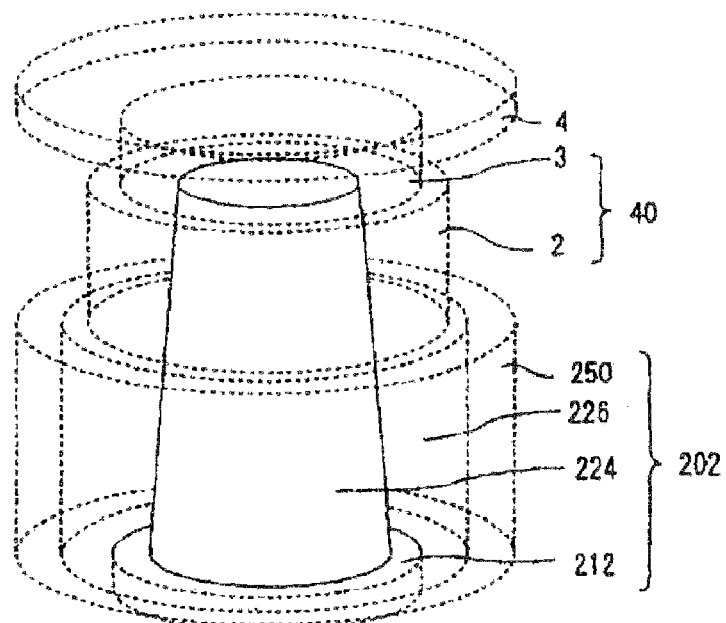
FIG. 30 is a schematic perspective view of a substantial part illustrating by way of example a part of the through-hole electrode used for the semiconductor device of the second exemplary embodiment.

FIG. 30 is a schematic perspective view illustrating by way of example a part of through-hole electrode 202 used for the semiconductor device of the second exemplary embodiment. In FIG. 30, internal through-hole electrode 224 included in through-hole electrode 202 is shown by solid lines. Internal through-hole electrode 224 is formed by growing titanium to a thickness of 150 nm and copper to a thickness of 600 nm inside the via hole approximately 20 μm in diameter, as the seed film for plating, using a sputtering method, and then burying copper in this seed film by plating. As shown by way of example in FIG. 30, cylindrical semiconductor silicon 226 is disposed so as to surround internal through-hole electrode 224, and outer-circumferentially cylindrical insulator 250 is further disposed so as to surround the outside of the cylindrical semiconductor silicon.

Cylindrical semiconductor silicon 226 is composed of part of semiconductor silicon layer 1 located in a position corresponding to the cylindrical semiconductor silicon. Outer-circumferentially cylindrical insulator 250 is composed of an insulating material such as oxide silicon or silicon nitride. The width (in the lateral direction of FIG. 30) of cylindrical electrode/substrate-separating hole 240 (not illustrated in the drawing, as the figure of the hole overlaps with that of outer-circumferentially cylindrical insulator 250) within semiconductor silicon layer 1 in which this insulating material is buried is approximately 2 μm. The diameter of outer-circumferentially cylindrical insulator 250 buried in this cylindrical electrode/substrate-separating hole 240 is approximately 30 μm, and the film thickness thereof (in the lateral direction of FIG. 30) is in the range from 1 to 2 μm.

In addition, internal through-hole electrode 224 is formed so as to penetrate through polysilicon contact pad 2. The diameter of this polysilicon contact pad 2 is approximately 26 μm, and the film thickness thereof (in the vertical direction of FIG. 30) is in the range from 1 to 2 μm.

Over polysilicon contact pad 2, there is formed metal interconnect layer 4 electrically connected to metal contact pad 3. The diameter of this metal contact pad 3 is approximately 26 μm and the film thickness thereof (in the vertical direction of FIG. 30) is approximately 0.5 μm.

In addition, as described according to the first and second exemplary embodiments, through-hole electrodes 200 and 202 included in the semiconductor device of the present invention are buried inside via hole 70 penetrating through semiconductor silicon layer 1 and polysilicon contact pad 2.

In regard to the above-described step of manufacturing a through-hole electrode, the second exemplary embodiment includes, prior to the step of forming the through-hole electrode from the rear surface side of semiconductor silicon layer 1, the steps of (a) forming the conductive pad with which the through-hole electrode has contact from the rear surface side of the semiconductor silicon layer, and (b) forming outer-circumferentially cylindrical insulator 250 from the front surface side of the semiconductor silicon layer, so as to surround a region thereof in which the through-hole electrode is to be formed. Outer-circumferentially cylindrical insulator 250 may be circular or rectangular in terms of a planar shape, i.e., a shape as viewed from the principal surface of semiconductor silicon layer 1, and is only required to be formed so as to surround via hole 70. In addition, outer-circumferentially cylindrical insulator 250 is preferably formed so as to have contact with interlayer insulating film 10 over the front surface side of semiconductor silicon layer 1 and with insulating layer 60 over the rear surface side thereof.

By including these manufacturing steps, a via hole can be formed simply by etching semiconductor silicon layer 1 from the rear surface thereof. Consequently, the range of options for selecting conditions when forming the outer-circumferentially cylindrical insulator and the like becomes wider, compared with a case in which the outer-circumferentially cylindrical insulator is formed from the rear surface side of semiconductor silicon layer 1. That is, since the outer-circumferentially cylindrical insulator is buried from the front surface side of semiconductor silicon layer 1 in a preprocessing steps the outer-circumferentially cylindrical insulator (oxide silicon) can be formed as part of a usual step of forming a semiconductor element. As a method for growing this oxide silicon, it is possible to select various methods, including a thermal oxidation method, an LPCVD method and the like. In contrast, a semiconductor element is already formed in a preprocessing step in a case in which the outer-circumferentially cylindrical insulator is formed from the rear surface side of semiconductor silicon layer 1. Accordingly, it is no longer possible to use a thermal oxidation method or an LPCVD method for reasons of the problem of deterioration or operation failure with the semiconductor element due to heat when forming the outer-circumferentially cylindrical insulator.

Furthermore, it is possible to facilitate a step of forming a through-hole electrode, including an etching step of forming a via hole from the rear surface of the semiconductor silicon layer, a step of electrically insulating the through-hole electrode, a conductive pad and the like from the semiconductor silicon layer, and a step of burying metal, such as copper, in the via hole. This means that there is no need for conduction-preventing impurity region 5 for preventing conduction between first contact pad 2 and semiconductor silicon layer 1 which is required in the first exemplary embodiment. In addition, there is no need to form insulating layer 62 for preventing conduction between through-hole electrode 200 and semiconductor silicon layer 1. Consequently, it is possible to simplify a step to be applied from the rear surface of semiconductor silicon layer 1.

Furthermore, it is possible to completely and electrically isolate the through-hole electrode and the semiconductor silicon layer from each other.

Third Exemplary Embodiment

The manufacturing method of a third exemplary embodiment is completely the same as the manufacturing method of the first exemplary embodiment except that second contact pad 3 of the above-described first exemplary embodiment is not a metal contact pad but a polysilicon contact pad and that anisotropic etching is performed using metal interconnect layer 4 as an etching stopper until a via hole reaches to metal interconnect layer 4.

Figure 31:
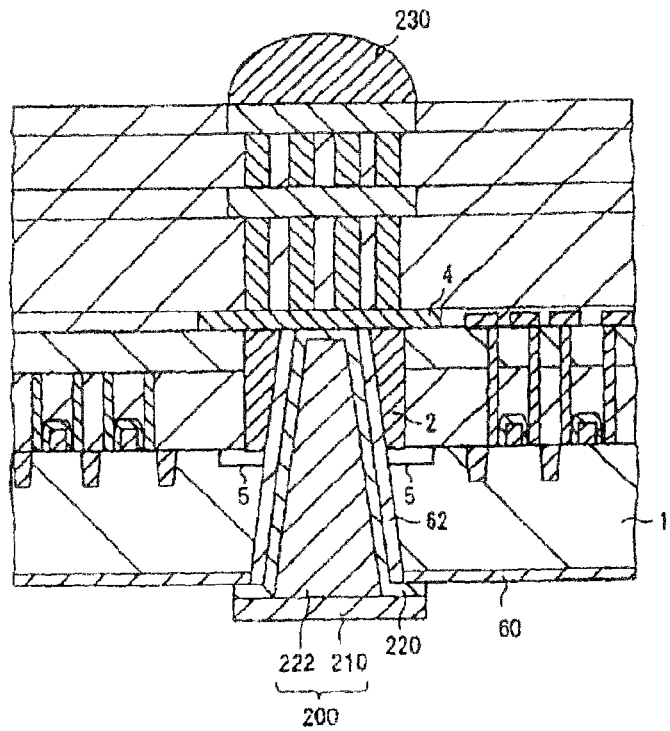
FIG. 31 is a schematic cross-sectional view of a substantial part used to explain a step of manufacturing a semiconductor device of a third exemplary embodiment.

FIG. 31 is a schematic cross-sectional view of a substantial part used to explain a step of manufacturing a semiconductor device of the third exemplary embodiment. Polysilicon contact pad 2 (corresponds to a combination of first contact pad 2 and second contact pad 3 of the first exemplary embodiment) is previously formed in contact with the front surface of semiconductor silicon layer 1 as a conductive pad. Consequently, it is possible to easily form through-hole electrode 200 from the rear surface side of semiconductor silicon layer 1. As respective steps of manufacturing this semiconductor device 403, it is possible to use the same steps as those of the above-described first exemplary embodiment.

Fourth Exemplary Embodiment

The manufacturing method of a fourth exemplary embodiment is completely the same as the manufacturing method of the second exemplary embodiment except that second contact pad 3 of the above-described second exemplary embodiment is not a metal contact pad but a polysilicon contact pad and that anisotropic etching is performed using metal interconnect layer 4 as an etching stopper until a via hole reaches to metal interconnect layer 4.

Figure 32:
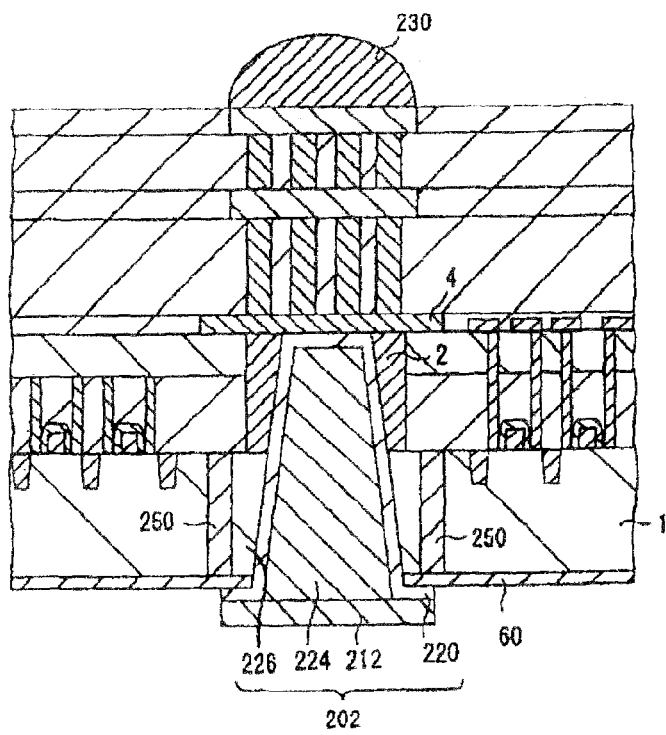
FIG. 32 is a schematic cross-sectional view of a substantial part used to explain a step of manufacturing a semiconductor device of a fourth exemplary embodiment.
Figure 33:
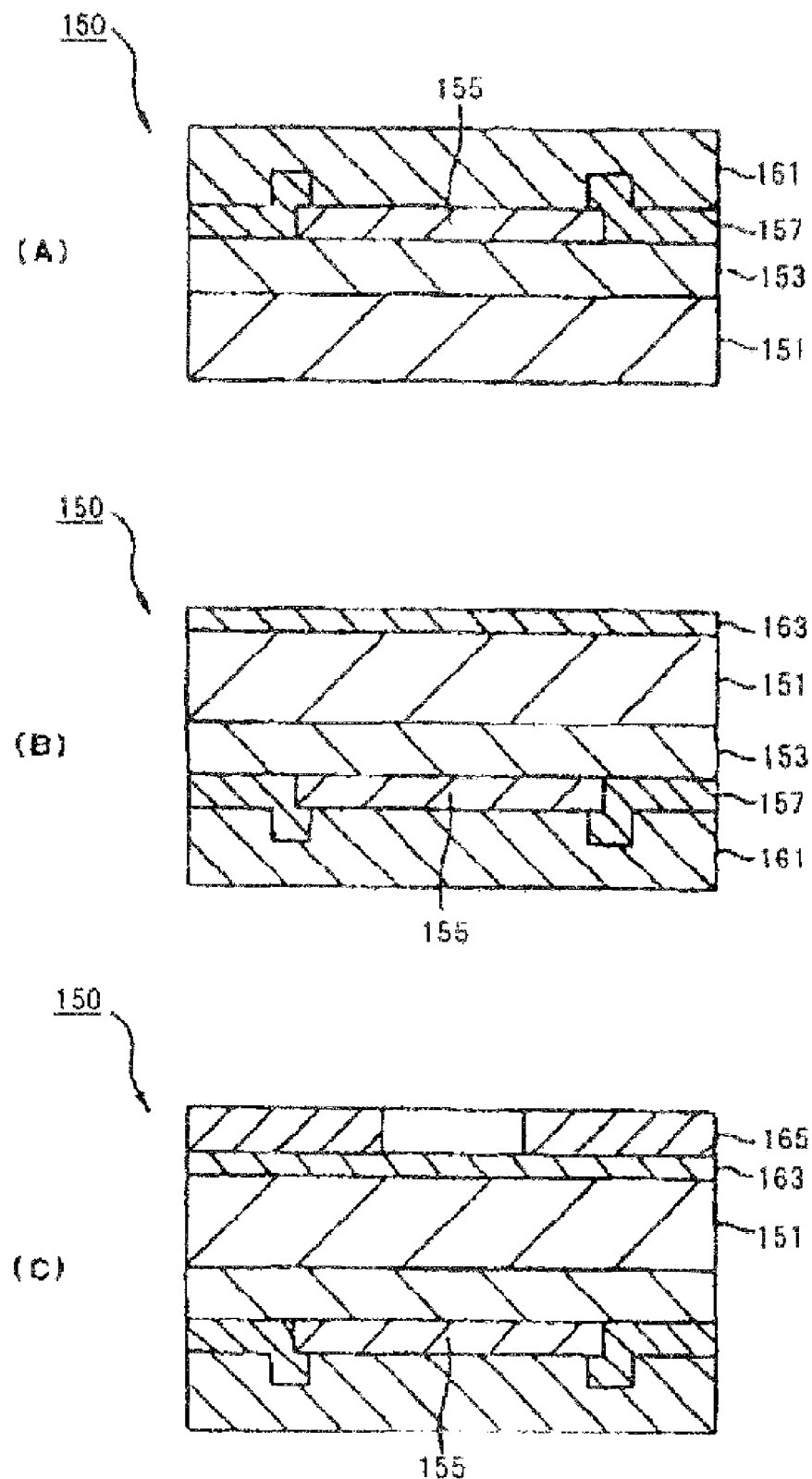
FIG. 33 is a schematic cross-sectional view of a substantial part used to explain a step of manufacturing a related semiconductor device.
Figure 34:
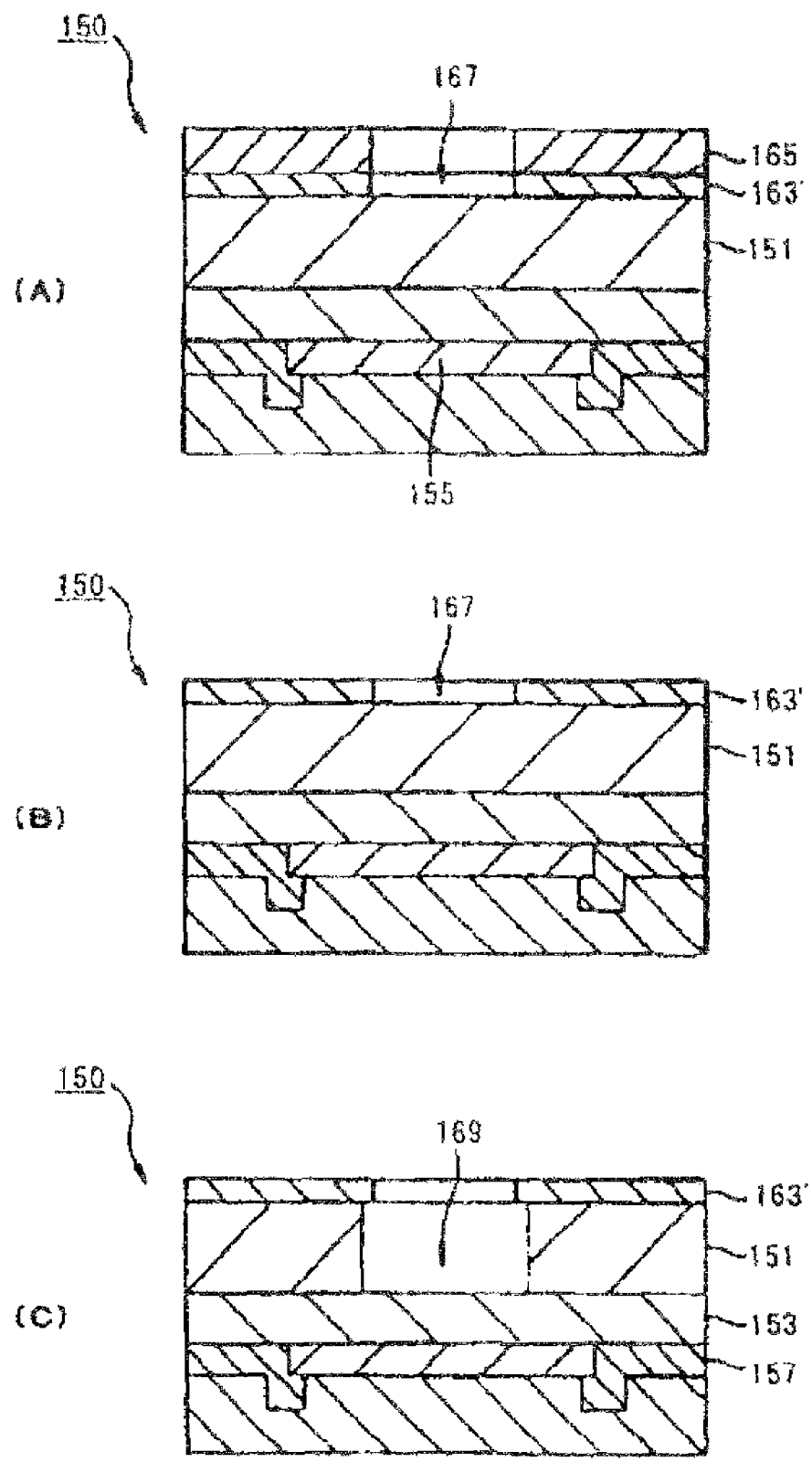
FIG. 34 is another schematic cross-sectional view of a substantial part used to explain a step of manufacturing the related semiconductor device.
Figure 35:
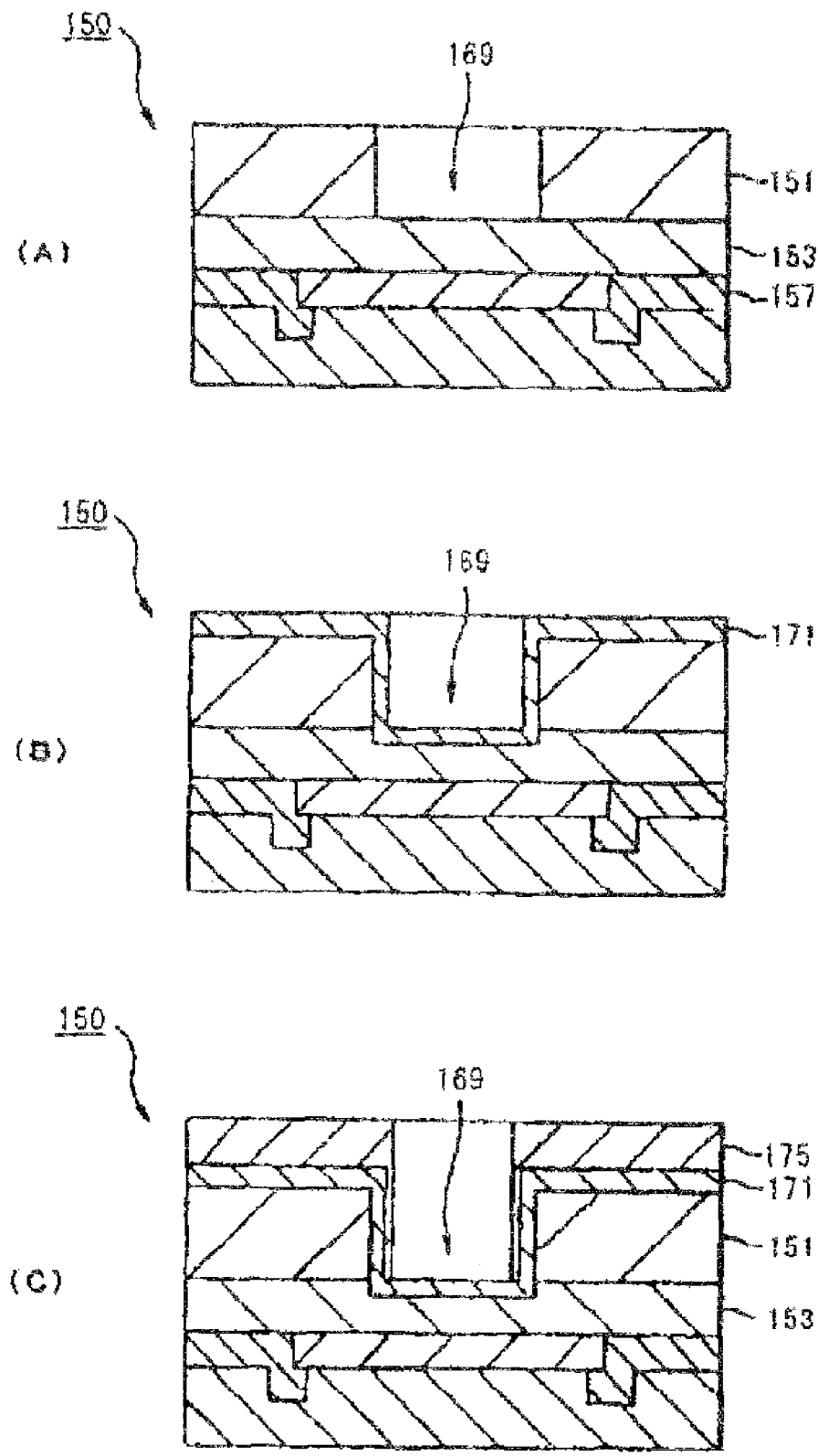
FIG. 35 is yet another schematic cross-sectional view of a substantial part used to explain a step of manufacturing the related semiconductor device.
Figure 36:
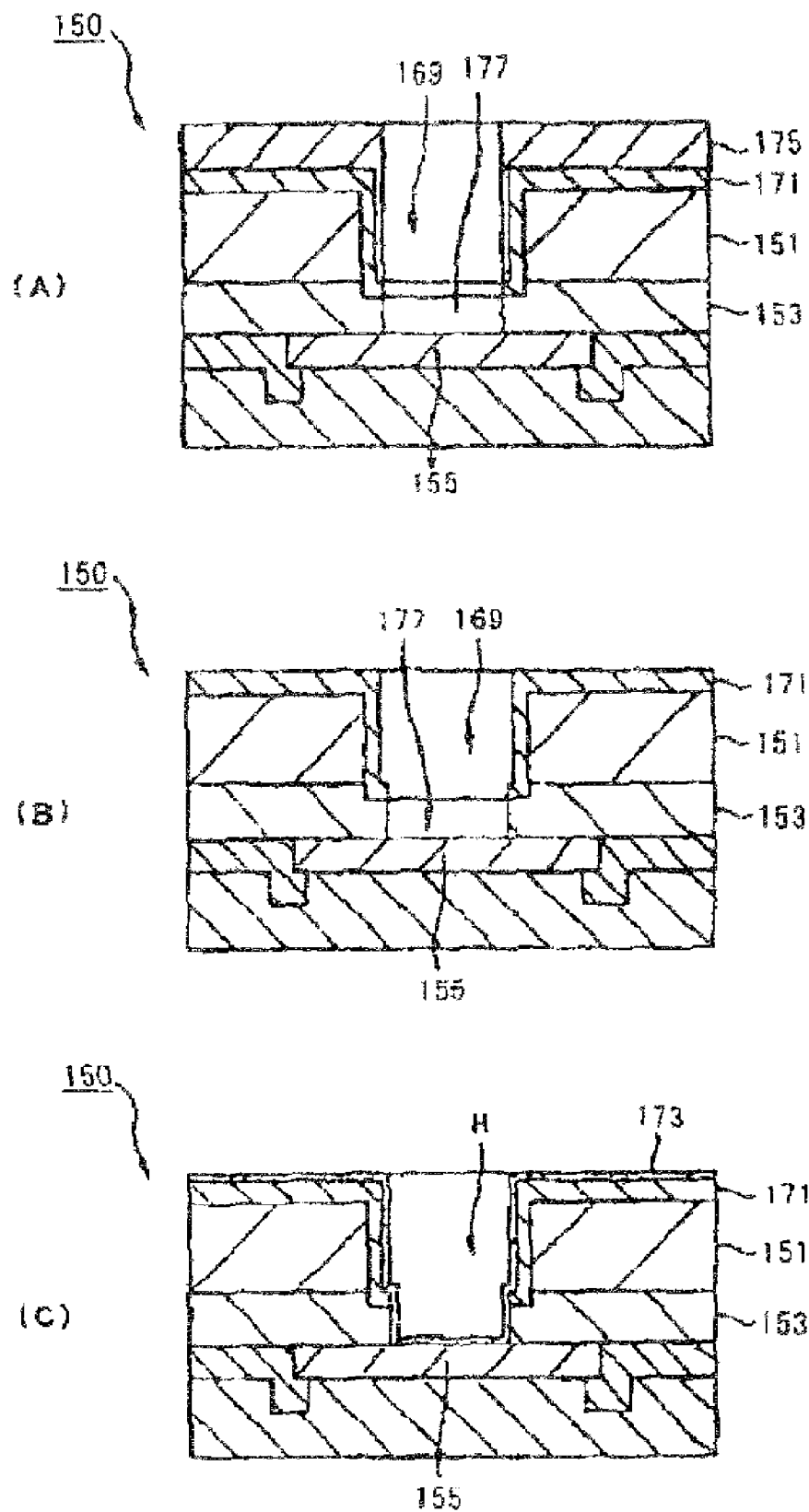
FIG. 36 is still another schematic cross-sectional view of a substantial part used to explain a step of manufacturing the related semiconductor device.
Figure 37:
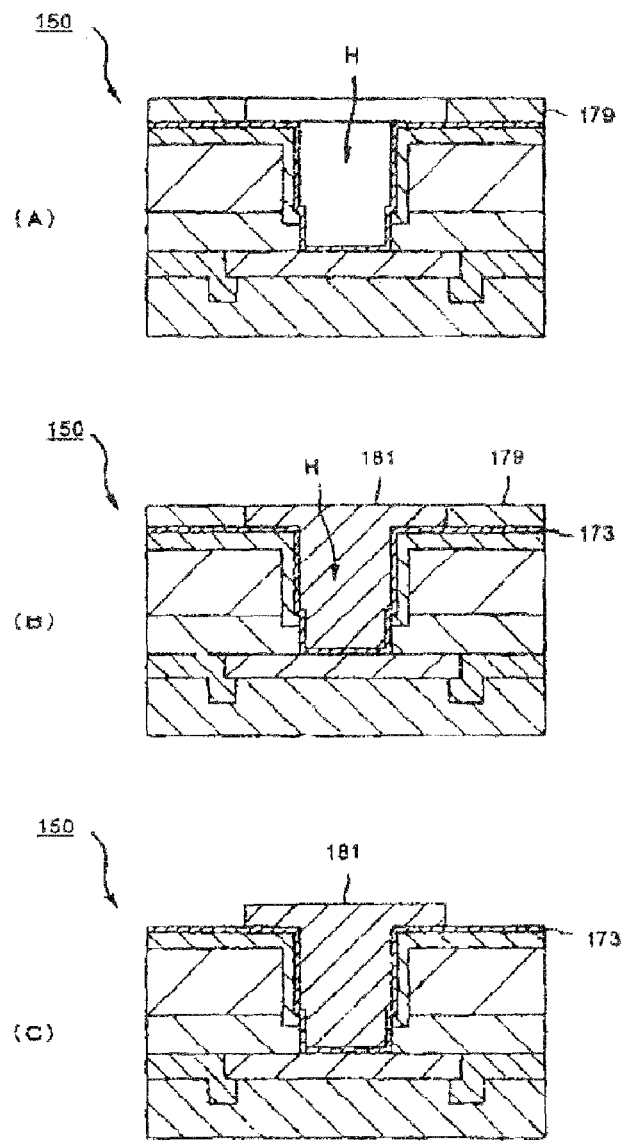
FIG. 37 is still another schematic cross-sectional view of a substantial part used to explain a step of manufacturing the related semiconductor device.
Figure 38:
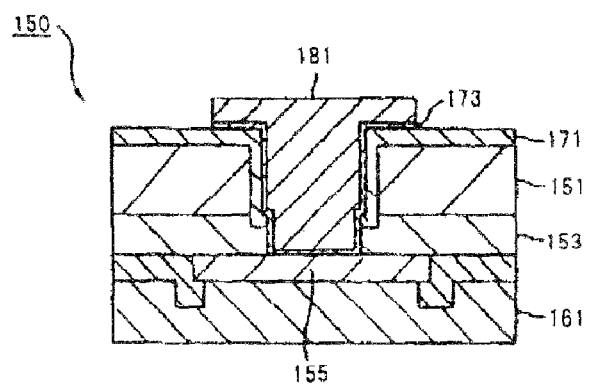
FIG. 38 is still another schematic cross-sectional view of a substantial part used to explain a step of manufacturing the related semiconductor device.

FIG. 32 is a schematic cross-sectional view of a substantial part used to explain a step of manufacturing a semiconductor device of the fourth exemplary embodiment. Polysilicon contact pad 2 (corresponds to a combination of first contact pad 2 and second contact pad 3 of the second exemplary embodiment) is previously formed in contact with the front surface of semiconductor silicon layer 1 as a conductive pad. Consequently, it is possible to easily form through-hole electrode 202 from the rear surface side of semiconductor silicon layer 1. As respective steps of manufacturing this semiconductor device 404, it is possible to use the same steps as those of the above-described second exemplary embodiment.

According to the manufacturing methods of the third and fourth exemplary embodiments, a conductive pad composed of polysilicon contact pad 2 is previously formed in contact with the front surface of semiconductor silicon layer 1, and this conductive pad and metal interconnect layer 4 are already electrically connected to each other. Therefore, there is no need to newly form a metal interconnect layer over the front surface side of semiconductor silicon layer 1 when forming each of through-hole electrodes 200 and 202 reaching to metal interconnect layer 4, from the rear surface side of semiconductor silicon layer 1.

As described according to the third and fourth exemplary embodiments, if a polysilicon contact pad is used in place of the metal contact pad composing second contact pad 3, then metal interconnect layer 4 functions as an etching stopper when carrying out anisotropic etching for the purpose of forming a via hole from the rear surface of semiconductor silicon layer 1. Consequently, the progress of the anisotropic etching slows down as soon as metal interconnect layer 4 is exposed and, therefore, the etching is stopped at this moment. As described above, each of the third and fourth exemplary embodiments is also one of exemplary embodiments whereby the technical idea of the present invention is realized. The idea of the present invention has thus been realized and each exemplary embodiment can exercise the advantageous effect of the present invention.

Incidentally, an explanation has been made of the first and second exemplary embodiments by taking, as examples, DRAM devices respectively as semiconductor devices 401 and 402. In these DRAM devices, polysilicon is used as a material for burial of a cell contact or the like in a memory cell array, as described above. Accordingly, it is possible to form polysilicon pad 2 (first contact pad) and cell contact 90 (first contact) in the same step. In addition, by using tungsten, which is the same as the material of a conductive material plug for burying second contact 100 to be connected to a peripheral circuit, also for metal contact pad 3 (second contact pad), the plug and the contact pad can be formed in the same step.

Accordingly, in the case of the first and second exemplary embodiments, it is possible to eliminate the need to add a step used to form polysilicon pad 2 (first contact pad) and metal contact pad 3 (second contact pad) as a separate step. Furthermore, it is possible to continuously etch semiconductor silicon layer 1 and polysilicon pad 2 without changing the etching conditions. This is extremely advantageous in terms of throughput and cost at the time of manufacture.

Example of Modification 1 of Exemplary Embodiments

Example of modification 1 differs from the above-described first or second exemplary embodiment in that first contact pad 2 is formed of, for example, tungsten in place of polysilicon and second contact pad 3 is formed of, for example, aluminum or copper. In this case, aluminum or copper may be used as the material of metal interconnect layer 4. Consequently, in a manufacturing method of this example of modification, it is possible to form via hole 70 from the rear surface side of semiconductor silicon layer 1, so as to penetrate through insulating layer 60 and semiconductor silicon layer 1, using the same method as used in the first or second exemplary embodiment Since first contact pad 2 is made of tungsten, it is also possible to finish etching the moment via hole 70 reaches this tungsten.

Furthermore, it is possible to etch tungsten serving as first contact pad 2 in succession to the etching of semiconductor silicon layer 1, as in the case of the first exemplary embodiment, under the presence of a fluorine-containing gas (for example, $SF_6$). Hence, via hole 70 is preferably formed until the via hole reaches second contact pad 3 (aluminum, copper or the like). The reason for this is that it is possible to increase the area of contact between a through-hole electrode and first contact pad 2 formed inside via hole 70 by forming via hole 70 until the via hole 70 reaches second contact pad 3, and that it is possible to reduce the electrical resistance of a contact zone.

In this example of modification, via hole 70 can be formed by forming first contact pad 2 from tungsten and second contact pad 3 from aluminum or copper, so that the tungsten is RIE-etched using aluminum or copper as an etching stopper, and by etching first contact pad 2 until second contact pad 3 is exposed.

It is also possible to stop etching the tungsten serving as first contact pad 2 partway, so that via hole 70 is formed midway through first contact pad 2. However, consideration needs to be given to the fact that the area of contact between the through-hole electrode and first contact pad 2 decreases in this case, thus increasing the electrical resistance of the contact zone.

Example of Modification 2 of Exemplary Embodiments

Example of modification 2 differs from the above-described first or second exemplary embodiment in that first contact pad 2 is formed of tungsten in place of polysilicon. This means that in the first or second exemplary embodiment, both first contact pad 2 and second contact pad 3 are metal contact pads made of the same material. Consequently, in a manufacturing method of this example of modification, it is possible to form via hole 70 from the rear surface side of semiconductor silicon layer 1, so as to penetrate through insulating layer 60 and semiconductor silicon layer 1, using the same method as used in the first or second exemplary embodiment. Since first contact pad 2 is made of tungsten, it is possible to finish etching the moment via hole 70 reaches this tungsten.

Also in this example of modification, it is possible to etch tungsten serving as first and second contact pads 2 and 3 in the same step as used for semiconductor silicon layer 1, in succession to the etching of semiconductor silicon layer 1, under the presence of a fluorine-containing gas (for example, $SF_6$) as the first embodiment. Hence, it is preferable to use aluminum, copper or the like as the material of metal interconnect layer 4 and use this material as an etching stopper to form via hole 70 penetrating through first and second contact pads 2 and 3 and reaching to metal interconnect layer 4. The reason for this is that it is possible to increase the area of contact between a through-hole electrode and a low-resistance metal contact pad (tungsten) formed inside via hole 70 and that it is possible to dramatically reduce the electrical resistance of a contact zone. Also in the case of this example of modification, it is possible to stop etching the tungsten serving as first and second contact pads 2 and 3 partway, so that via hole 70 is formed midway through the tungsten. However, consideration needs to be given to the fact that the area of contact between the through-hole electrode and first and second contact pads naturally decreases in this case, thus increasing the electrical resistance of the contact zone.

The tungsten serving as first contact pad 2 may be deposited in the same step as the tungsten serving as second contact pad 3 or these tungsten materials may be respectively deposited in separate steps.

In the first exemplary embodiment, the second exemplary embodiment, the third exemplary embodiment the fourth exemplary embodiment and examples of modification 1 and 2 of the present invention, a description has been made of a case in which tungsten is used as the metal materials of first contact pad 2, second contact pad 3 and metal interconnect layer 4. Alternatively, as these metal materials, it is possible to use aluminum, titanium, copper, or an alloy made of a plurality of materials selected from among these materials, in addition to tungsten. It is also possible to use a multilayer structure composed of any of these metals or alloys and titanium nitride, tungsten nitride or tantalum nitride.

In addition, in examples of modification 1 and 2, it is possible to determine, as appropriate, which metal materials to be used as first contact pad 2, second contact pad 3, and metal interconnect layer 4, depending on which constituent element to be etched and which constituent element to be used as an etching stopper, among these constituent elements, when forming a via hole. Here, an etching selection ratio needs to be ensured within a practical range between a structural object to be etched and a structural object to be used as an etching stopper under applied etching conditions.

In the respective semiconductor devices of the first exemplary embodiment, the second exemplary embodiment, the third exemplary embodiment, the fourth exemplary embodiment and examples of modification 1 and 2 of the present invention, an explanation has been made of the formation of a single through-hole electrode. It is a matter of course, however, to be able to obtain a configuration in which a plurality of through-hole electrodes are formed in a semiconductor device of the present invention, so that a through-hole electrode for a signal to simply pass through the semiconductor device and a through-hole electrode to be connected to an element of the semiconductor device through a metal interconnect layer are mixed. Alternatively, it is possible to provide only one of these two types through-hole electrode. Still alternatively, it is possible to apply the present invention to a semiconductor substrate, in which no semiconductor elements are formed but only through-hole electrodes are provided, and use this semiconductor substrate as an interposer.

It is apparent that the present invention is not limited to the above embodiments, but may be modified and changed without departing from the scope and spirit of the invention.

What is claimed is:

1. A semiconductor device, comprising:
    an insulating layer formed over a first principal surface of a semiconductor silicon layer;
    a conductive layer comprising a first conductive layer and a second conductive layer made of mutually different materials, wherein the first conductive layer is formed over the first principal surface and the second conductive layer is formed over the first conductive layer, so as to penetrate through a predetermined portion of the insulating layer;
    a via hole formed so as to penetrate through the semiconductor silicon layer and the first conductive layer to reach to the second conductive layer from a second principal surface side of the semiconductor silicon layer; and
    a through-hole electrode formed inside the via hole,
    wherein the first conductive layer is made of conductive polysilicon and the second conductive layer is made of a metal material.

2. The semiconductor device according to claim 1, wherein the second conductive layer is made of tungsten, titanium, aluminum or copper or of an alloy made of a plurality of materials selected from the group consisting of tungsten, titanium, aluminum and copper, and the second conductive layer serves as an etching stopper when forming the via hole.

3. The semiconductor device according to claim 1, further comprising a cylindrical insulator surrounding a through-hole electrode forming region and penetrating through the semiconductor silicon layer in the thickness direction of the semiconductor silicon layer.

4. The semiconductor device according to claim 3, further comprising an insulating layer formed on the second principal surface side of the semiconductor silicon layer, so as to expose the through-hole electrode,
    wherein one end of the cylindrical insulator is in contact with the insulating layer formed over the first principal surface of the semiconductor silicon layer and, the other end of the cylindrical insulator is in contact with the insulating layer formed on the second principal surface side of the semiconductor silicon layer.

5. A semiconductor device, comprising:
    an insulating layer formed over a first principal surface of a semiconductor silicon layer;
    a conductive layer comprising a first conductive layer and a second conductive layer made of mutually different materials, wherein the first conductive layer is formed over the first principal surface and the second conductive layer is formed over the first conductive layer, so as to penetrate through a predetermined portion of the insulating layer;
    a via hole formed so as to penetrate through the semiconductor silicon layer and the first conductive layer to reach to the second conductive layer, from a second principal surface side of the semiconductor silicon layer;
    a through-hole electrode formed inside the via hole; and
    a conduction-preventing impurity region formed on the first principal surface side of the semiconductor silicon layer, so as to include a portion in contact with the first conductive layer.

6. The semiconductor device according to claim 5, wherein the first conductive layer is a first contact pad and the second conductive layer is a second contact pad.

7. The semiconductor device according to claim 5, wherein the first conductive layer is a conductive pad and the second conductive layer is an interconnect layer.

8. The semiconductor device according to claim 5, wherein the first conductive layer is made of tungsten, titanium, aluminum or copper or of an alloy made of a plurality of materials selected from the group consisting of tungsten, titanium, aluminum and copper.

9. A semiconductor device, comprising:
    a fourth insulating layer, a semiconductor silicon layer, a first insulating layer, a second insulating layer and a third insulating layer formed in order;
    a first contact pad penetrating through the first insulating layer in the thickness direction of the first insulating layer and made of conductive polysilicon;
    a second contact pad and an interconnect layer formed so as to respectively penetrate through positions corresponding to the first contact pad within the second and the third insulating layers in the thickness directions of the second and the third insulating layers;

a through-hole electrode formed so as to penetrate through at least the fourth insulating layer, the semiconductor silicon layer and the first contact pad to reach to the second contact pad;

a fifth insulating layer formed at least between the through-hole electrode and the semiconductor silicon layer; and a conduction-preventing impurity region formed in the semiconductor silicon layer so as to include a portion in contact with the first contact pad.

10. A semiconductor device, comprising:

a fourth insulating layer, a semiconductor silicon layer, a first insulating layer, a second insulating layer and a third insulating layer formed in order;

a first contact pad penetrating through the first insulating layer in the thickness direction of the first insulating layer and made of conductive polysilicon;

a second contact pad and an interconnect layer formed so as to respectively penetrate through positions corresponding to the first contact pad within the second and the third insulating layers in the thickness directions of the second and the third insulating layers;

a through-hole electrode formed so as to penetrate through at least the fourth insulating layer, the semiconductor silicon layer and the first contact pad to reach to the second contact pad; and a cylindrical insulator surrounding the through-hole electrode and penetrating through the semiconductor silicon layer in the thickness direction of the semiconductor silicon layer.

* * * * *